US012701807B2

(12) United States Patent
Kurihara

(10) Patent No.: US 12,701,807 B2
(45) Date of Patent: Aug. 4, 2026

(54) SOLID-STATE IMAGING DEVICE

(71) Applicant: Sony Semiconductor Solutions Corporation, Kanagawa (JP)

(72) Inventor: Takuya Kurihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 566 days.

(21) Appl. No.: 18/257,171

(22) PCT Filed: Jan. 12, 2022

(86) PCT No.: PCT/JP2022/000725
§ 371 (c)(1),
(2) Date: Jun. 13, 2023

(87) PCT Pub. No.: WO2022/163351
PCT Pub. Date: Aug. 4, 2022

(65) Prior Publication Data
US 2024/0038807 A1     Feb. 1, 2024

(30) Foreign Application Priority Data

Jan. 26, 2021     (JP) ................................. 2021-010432

(51) Int. Cl.
*H10F 39/00*        (2025.01)
*H04N 23/667*       (2023.01)
(Continued)

(52) U.S. Cl.
CPC ......... *H10F 39/807* (2025.01); *H04N 23/667* (2023.01); *H04N 25/62* (2023.01);
(Continued)

(58) Field of Classification Search
None
See application file for complete search history.

(56) References Cited

U.S. PATENT DOCUMENTS

2017/0062501 A1*   3/2017   Velichko ............. H10F 39/8037
2018/0350856 A1*  12/2018   Masagaki ............. H10F 39/813
(Continued)

FOREIGN PATENT DOCUMENTS

JP        2013175494 A      9/2013
JP        2015018969 A      1/2015
(Continued)

OTHER PUBLICATIONS

International Search Report (PCT/ISA/210), International Application No. PCT/JP2022/000725, dated Apr. 5, 2022.

*Primary Examiner* — Benjamin P Sandvik
(74) *Attorney, Agent, or Firm* — Michael Best & Friedrich LLP

(57)        ABSTRACT

Provided is a solid-state imaging device capable of forming a pixel separation groove having a suitable action in a substrate.
A solid-state imaging device of the present disclosure includes: a first photoelectric conversion unit and a second photoelectric conversion unit that are provided in a first semiconductor substrate and are adjacent to each other; a first pixel separation groove provided between the first photoelectric conversion unit and the second photoelectric conversion unit not to penetrate through the first semiconductor substrate; and a second pixel separation groove provided to penetrate through the first semiconductor substrate.

20 Claims, 20 Drawing Sheets

(51) Int. Cl.

| | | |
|---|---|---|
| *H04N 25/62* | (2023.01) | |
| *H04N 25/77* | (2023.01) | |
| *H04N 25/79* | (2023.01) | |
| *H10F 39/12* | (2025.01) | |
| *H10F 39/18* | (2025.01) | |

(52) U.S. Cl.
CPC ............. *H04N 25/77* (2023.01); *H04N 25/79* (2023.01); *H10F 39/182* (2025.01); *H10F 39/1843* (2025.01); *H10F 39/199* (2025.01); *H10F 39/80373* (2025.01); *H10F 39/8053* (2025.01); *H10F 39/8063* (2025.01); *H10F 39/809* (2025.01); *H10F 39/813* (2025.01)

(56)                    References Cited

U.S. PATENT DOCUMENTS

| | | | | |
|---|---|---|---|---|
| 2020/0235148 | A1* | 7/2020 | Shim ................... | H10F 39/8027 |
| 2020/0243579 | A1* | 7/2020 | Pyo ....................... | H10F 39/813 |
| 2021/0193703 | A1* | 6/2021 | Watanabe ............... | H10F 39/18 |
| 2022/0109012 | A1* | 4/2022 | Moon ................... | H10F 39/199 |
| 2022/0216250 | A1* | 7/2022 | Lee ..................... | H10F 39/8063 |
| 2023/0188871 | A1* | 6/2023 | Arakawa ............. | H04N 25/621 |
| | | | | 348/294 |

FOREIGN PATENT DOCUMENTS

| | | |
|---|---|---|
| JP | 2018201015 A | 12/2018 |
| JP | 2019145544 A | 8/2019 |
| WO | 2017130723 A1 | 8/2017 |

* cited by examiner

SOLID-STATE IMAGING DEVICE

TECHNICAL FIELD

The present disclosure relates to a solid-state imaging device.

BACKGROUND ART

When a pixel size of a solid-state imaging device is reduced, there is a possibility that light that is to enter a photoelectric conversion unit of a certain pixel enters a photoelectric conversion unit of another pixel to cause crosstalk between the pixels. Therefore, a pixel separation groove that surrounds each of the photoelectric conversion units in a plan view is sometimes provided in a substrate for each of the photoelectric conversion units.

CITATION LIST

Patent Document

Patent Document 1: Japanese Patent Application Laid-Open No. 2015-18969
Patent Document 2: Japanese Patent Application Laid-Open No. 2018-201015
Patent Document 3: International Publication No. 2017/130723

SUMMARY OF THE INVENTION

Problems to be Solved by the Invention

Types of the pixel separation groove include a through groove formed so as to penetrate through the substrate and a non-through groove formed so as not to penetrate through the substrate. The through groove has an advantage that a light amount range in which a phase difference can be acquired is wide, but has a disadvantage that overflow between pixels of the same color is not possible. On the other hand, the non-through groove has an advantage that overflow between pixels of the same color is possible, but has a disadvantage that a light amount range in which a phase difference can be acquired is narrow. It is desirable to achieve a pixel separation groove that can obtain both the advantage of the through groove and the advantage of the non-through groove.

Therefore, the present disclosure provides a solid-state imaging device capable of forming a pixel separation groove having a suitable action in a substrate.

Solutions to Problems

A solid-state imaging device of a first aspect of the present disclosure includes: first and second photoelectric conversion units that are provided in a first semiconductor substrate and are adjacent to each other; a first pixel separation groove provided between the first photoelectric conversion unit and the second photoelectric conversion unit not to penetrate through the first semiconductor substrate; and a second pixel separation groove provided to penetrate through the first semiconductor substrate. Therefore, for example, it is possible to obtain an advantage of a non-through groove by the first pixel separation groove, and it is possible to obtain an advantage of a through groove by the second pixel separation groove, so that it is possible to form pixel separation grooves having a suitable action in the first semiconductor substrate.

Furthermore, in the first aspect, the first pixel separation groove may be provided from a side of a light incident surface of the first semiconductor substrate toward a surface of the first semiconductor substrate on a side opposite to the light reflecting surface. Therefore, for example, in a solid-state imaging device of a back-illuminated type, the first pixel separation groove can be formed on a back surface of the first semiconductor substrate.

Furthermore, in the first aspect, the second pixel separation groove may be provided to surround at least the first and second photoelectric conversion units in a plan view. Therefore, for example, crosstalk between the first and second photoelectric conversion units and other photoelectric conversion units can be suppressed by the second pixel separation groove.

Furthermore, in the first aspect, the second pixel separation groove may form a pixel separation groove a pixel separation groove that surrounds the first and second photoelectric conversion units for each of the photoelectric conversion units together with the first pixel separation groove. Therefore, for example, crosstalk between the photoelectric conversion units can be suppressed by the first and second pixel separation grooves.

Furthermore, in the first aspect, the second pixel separation groove may be further provided between the first photoelectric conversion unit and the second photoelectric conversion unit together with the first pixel separation groove. Therefore, for example, it is possible to increase a proportion of the through groove (second pixel separation groove) to the entire pixel separation groove.

Furthermore, in the first aspect, the second pixel separation groove may surround N photoelectric conversion units (N is an integer of two or more) including the first and second photoelectric conversion units, and the N photoelectric conversion units may correspond to one on-chip lens provided on the first semiconductor substrate. Therefore, for example, a photoelectric conversion unit corresponding to a certain on-chip lens and a photoelectric conversion unit corresponding to another on-chip lens can be separated by the through groove (second pixel separation groove).

Furthermore, in the first aspect, the N photoelectric conversion units may be provided in N pixels which are pixels of the same color. Therefore, for example, a photoelectric conversion unit corresponding to a certain color and a photoelectric conversion unit corresponding to another color can be separated by the through groove (second pixel separation groove).

Furthermore, in the first aspect, the second pixel separation groove may surround N photoelectric conversion units (N is an integer of two or more) including the first and second photoelectric conversion units, and the N photoelectric conversion units may correspond to two on-chip lenses provided on the first semiconductor substrate. Therefore, for example, the photoelectric conversion units can be protected for every two on-chip lenses by the through groove (second pixel separation groove).

Furthermore, in the first aspect, the second pixel separation groove may surround N photoelectric conversion units (N is an integer of two or more) including the first and second photoelectric conversion units, and the N photoelectric conversion units may correspond to N on-chip lenses provided on the first semiconductor substrate. Therefore, for example, the photoelectric conversion units corresponding to the on-chip lenses on a one-to-one basis can be collectively protected for every multiple photoelectric conversion units by the through groove (second pixel separation groove).

Furthermore, in the first aspect, the N may be a square of K (K is an integer of three or more). Therefore, for example, K×K photoelectric conversion units arranged in a two-dimensional array can be collectively protected by the second pixel separation groove.

Furthermore, the solid-state imaging device of the first aspect may further include a floating diffusion unit provided at a position at least partially overlapping the first pixel separation groove in a plan view in the first semiconductor substrate. Therefore, for example, the first photoelectric conversion unit and the second photoelectric conversion unit can share the floating diffusion unit.

Furthermore, in the first aspect, the first pixel separation groove may include a first portion extending in a first direction and a second portion extending in a second direction, and the floating diffusion unit may be provided at a position at least partially overlapping an intersection portion between the first portion and the second portion in a plan view in the first semiconductor substrate. Therefore, for example, the floating diffusion unit can be shared by four photoelectric conversion units including the first and second photoelectric conversion units.

Furthermore, in the first aspect, the first pixel separation groove may include a first portion extending in a first direction and a second portion extending in a second direction, and the first direction and the second direction may be non-parallel and non-perpendicular to an end surface of a chip including the solid-state imaging device. Therefore, it is possible to achieve the solid-state imaging device having suitable performance, for example, even in a case where a front surface of a substrate can be various surfaces such as a plane {100} and a plane {110}, or in a case where a direction from a notch of the substrate toward the center can be various directions such as a direction <100> and a direction <110>.

Furthermore, the solid-state imaging device of the first aspect may further include first and second transfer transistors that are provided under the first and second photoelectric conversion units and have gate electrodes, respectively, being at least partially provided in a first interlayer insulating film. Therefore, for example, a path of a charge from the first photoelectric conversion unit on the first transfer transistor to the second photoelectric conversion unit on the second transfer transistor can appear.

Furthermore, in the first aspect, the second pixel separation groove may surround N photoelectric conversion units (N is an integer of two or more) including the first and second photoelectric conversion units, the solid-state imaging device may further include a reset, selection, or amplification transistor provided under any photoelectric conversion unit of the N photoelectric conversion units, and the first transfer transistor, the second transfer transistor, and the reset, selection, or amplification transistor may be provided on the surface of the first semiconductor substrate on the side opposite to the light incident surface. Therefore, for example, the transfer transistors and the other pixel transistor (reset, selection, or amplification transistor) can be suitably arranged.

Furthermore, the solid-state imaging device of the first aspect may further include a second semiconductor substrate that is provided to face a first interlayer insulating film provided on a surface of the first semiconductor substrate on a side opposite to a light incident surface, and the second semiconductor substrate may include at least a part of a pixel transistor other than the transfer transistors. Therefore, for example, the pixel transistor can be suitably arranged in the second semiconductor substrate.

A solid-state imaging device of a second aspect of the present disclosure includes: first and second photoelectric conversion units that are provided in the first semiconductor substrate and are adjacent to each other; a floating diffusion unit provided in the first semiconductor substrate; and first and second transfer transistors respectively provided under the first and second photoelectric conversion units, the first and second transfer transistors operating to provide: a first mode in which a path of a charge from the first photoelectric conversion unit to the floating diffusion unit is closed and a path of a charge from the first photoelectric conversion unit to the second photoelectric conversion unit is closed; a second mode in which the path of the charge from the first photoelectric conversion unit to the floating diffusion unit is closed, and the path of the charge from the first photoelectric conversion unit to the second photoelectric conversion unit is opened; and a third mode in which the path of the charge from the first photoelectric conversion unit to the floating diffusion unit is opened. Therefore, for example, a phase difference can be acquired when a light amount is large by using the first mode, the phase difference can be acquired when the light amount is small by using the second mode, and the charge can be transferred to the floating diffusion unit by using the third mode.

Furthermore, the solid-state imaging device of the second aspect may further include a first pixel separation groove provided between the first photoelectric conversion unit and the second photoelectric conversion unit not to penetrate through the first semiconductor substrate, and the floating diffusion unit may be provided under the first pixel separation groove in the first semiconductor substrate. Therefore, for example, it is possible to obtain the advantage of the non-through groove by the first pixel separation groove. For example, when the floating diffusion unit is provided under the first pixel separation groove, the first photoelectric conversion unit and the second photoelectric conversion unit can share the floating diffusion unit.

Furthermore, the solid-state imaging device of the second aspect may further include a second pixel separation groove provided to penetrate through the first semiconductor substrate, and the second pixel separation groove may be provided to surround at least the first and second photoelectric conversion units in a plan view. Therefore, for example, it is possible to obtain the advantage of the through groove by the second pixel separation groove. For example, when the second pixel separation groove is provided to surround the first and second photoelectric conversion units in a plan view, the crosstalk between the first and second photoelectric conversion units and other photoelectric conversion units can be suppressed by the second pixel separation groove.

Furthermore, the solid-state imaging device of the second aspect may further include a second semiconductor substrate that is provided to face a first interlayer insulating film provided on a surface of the first semiconductor substrate on a side opposite to a light incident surface, and the second semiconductor substrate may include at least a part of a pixel transistor other than the transfer transistors. Therefore, for example, the pixel transistor can be suitably arranged in the second semiconductor substrate.

MODE FOR CARRYING OUT THE INVENTION

Hereinafter, embodiments of the present disclosure will be described with reference to the drawings.

First Embodiment

Figure 1:
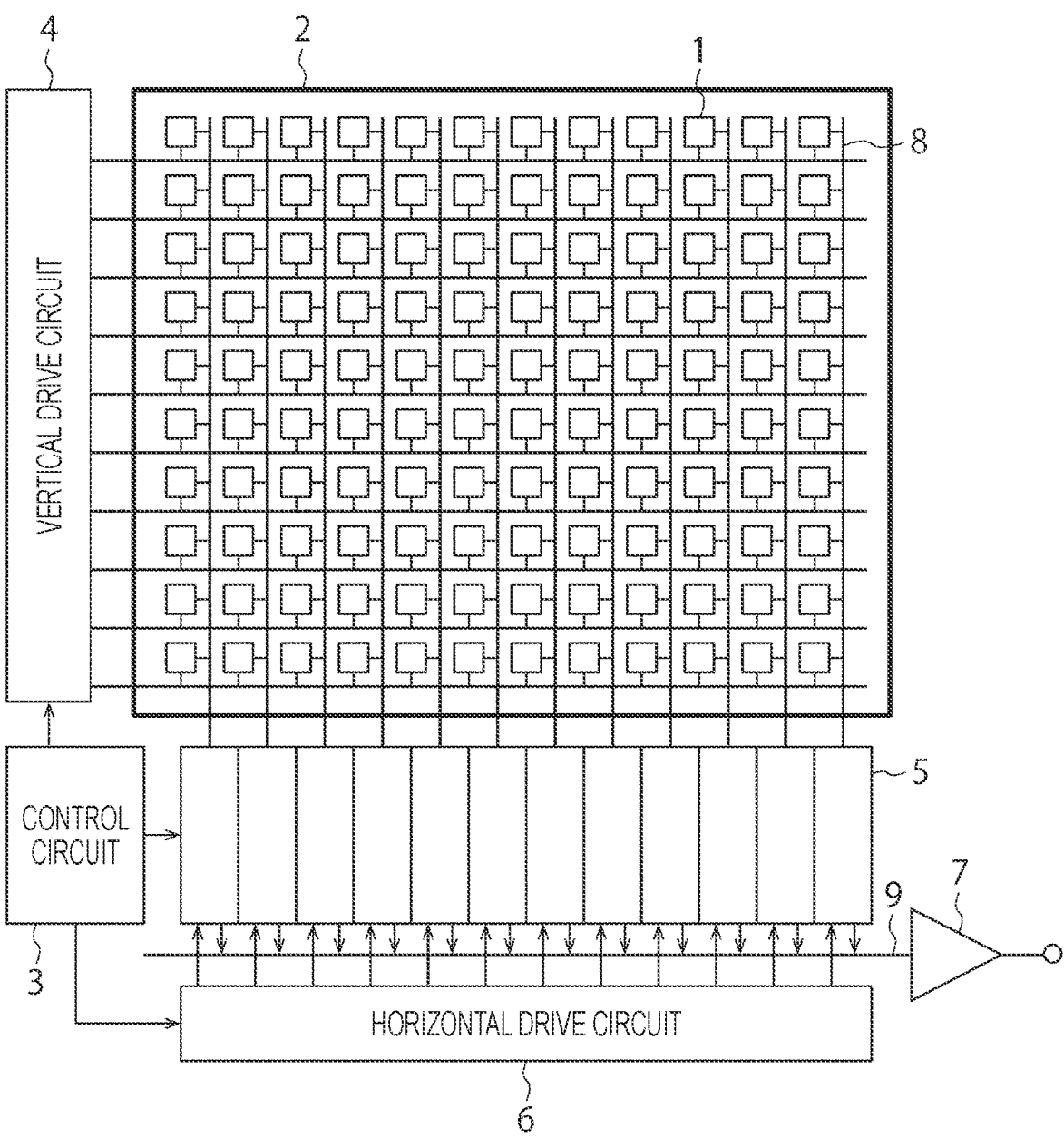
FIG. 1 is a block diagram illustrating a configuration of a solid-state imaging device of a first embodiment.

FIG. 1 is a block diagram illustrating a configuration of a solid-state imaging device of a first embodiment.

The solid-state imaging device in FIG. 1 is a complementary metal oxide semiconductor (CMOS) type image sensor, and includes a pixel array region 2 having a plurality of pixels 1, a control circuit 3, a vertical drive circuit 4, a plurality of column signal processing circuits 5, a horizontal drive circuit 6, an output circuit 7, a plurality of vertical signal lines 8, and a horizontal signal line 9.

Each of the pixels 1 includes a photodiode functioning as a photoelectric conversion unit and a MOS transistor functioning as a pixel transistor. Examples of the pixel transistor include a transfer transistor, a reset transistor, an amplification transistor, a selection transistor, and the like. These pixel transistors may be shared by several pixels 1.

The pixel array region 2 includes a plurality of the pixels 1 arranged in a two-dimensional array. The pixel array region 2 includes an effective pixel region that receives light, performs photoelectric conversion, amplifies and outputs a signal charge generated by the photoelectric conversion, and a black reference pixel region that outputs optical black serving as a reference of a black level. In general, the black reference pixel region is arranged on an outer peripheral portion of the effective pixel region.

The control circuit 3 generates various signals serving as references of operations of the vertical drive circuit 4, the column signal processing circuit 5, the horizontal drive circuit 6, and the like on the basis of a vertical synchronization signal, a horizontal synchronization signal, a master clock, and the like. The signals generated by the control circuit 3 are, for example, a clock signal and a control signal, and are input to the vertical drive circuit 4, the column signal processing circuit 5, the horizontal drive circuit 6, and the like.

The vertical drive circuit 4 includes, for example, a shift register, and scans each of the pixels 1 in the pixel array region 2 in the vertical direction row by row. Moreover, the vertical drive circuit 4 supplies a pixel signal based on the signal charge generated by each of the pixels 1 to the column signal processing circuit 5 through the vertical signal line 8.

The column signal processing circuit 5 is arranged, for example, for every column of the pixels 1 in the pixel array region 2, and performs signal processing of the signals output from the pixels 1 of one row for every column on the basis of a signal from the black reference pixel region. Examples of this signal processing are noise removal and signal amplification.

The horizontal drive circuit 6 includes, for example, a shift register, and supplies the pixel signal from each of the column signal processing circuits 5 to the horizontal signal line 9.

The output circuit 7 performs signal processing on the signal supplied from each of the column signal processing circuits 5 through the horizontal signal line 9, and outputs the signal subjected to the signal processing.

Figure 2:
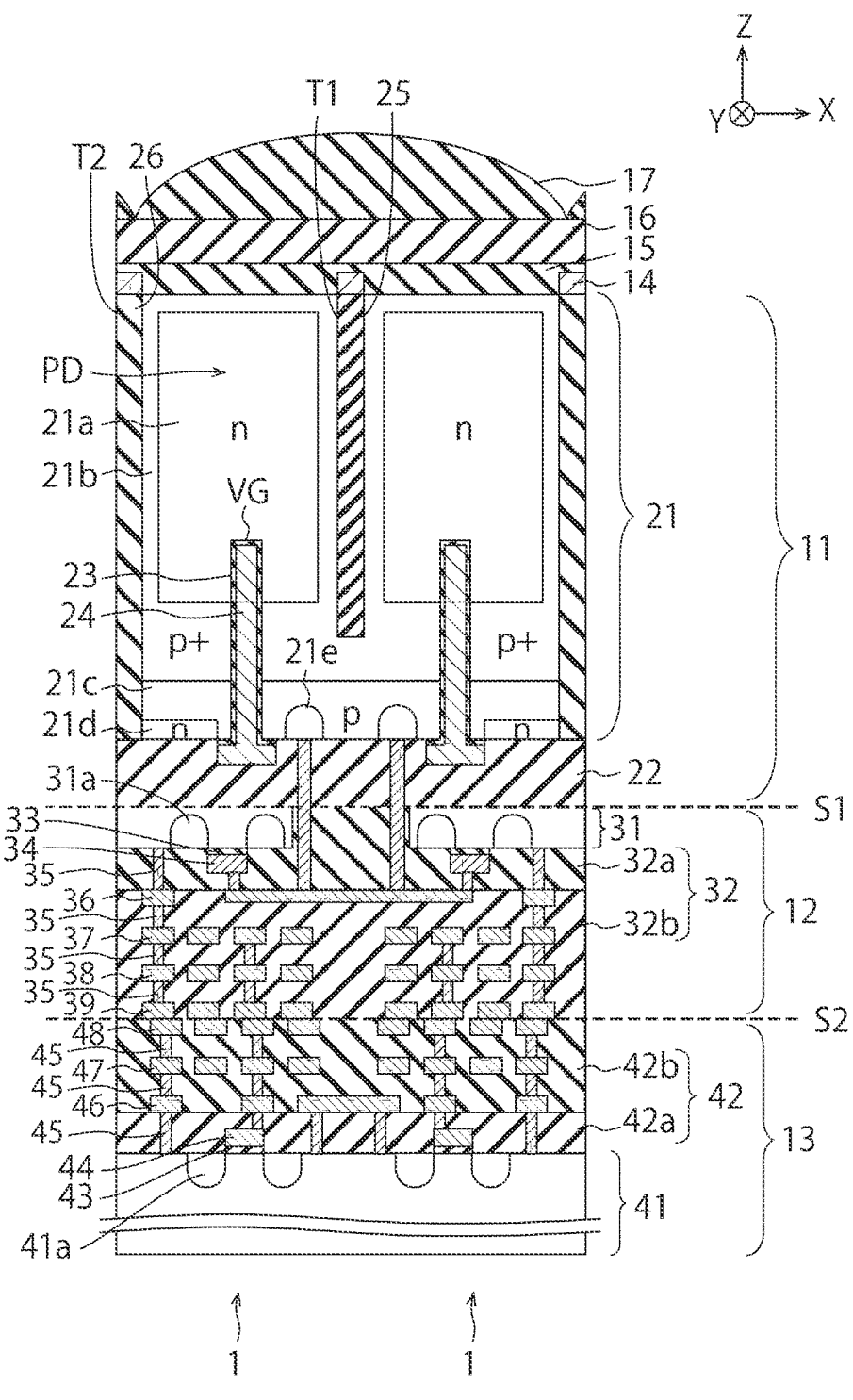
FIG. 2 is a vertical sectional view illustrating a structure of the solid-state imaging device of the first embodiment.

FIG. 2 is a vertical sectional view illustrating a structure of the solid-state imaging device of the first embodiment. FIG. 2 illustrates a vertical section of two pixels 1 included in the pixel array region 2 of FIG. 1.

FIG. 2 illustrates an X axis, a Y axis, and a Z axis perpendicular to each other. An X direction and a Y direction correspond to a lateral direction (horizontal direction), and a Z direction corresponds to a longitudinal direction (vertical direction). Furthermore, the +Z direction corresponds to an upward direction, and the −Z direction corresponds to a downward direction. The −Z direction may strictly match the gravity direction, or does not necessarily strictly match the gravity direction.

The solid-state imaging device of the present embodiment includes an upper substrate (first substrate) 11, an intermediate substrate (second substrate) 12, a lower substrate (third substrate) 13, a light shielding film 14, a planarization film 15, a color filter 16, and an on-chip lens 17. The on-chip lens 17 is an example of a lens of the present disclosure.

The upper substrate 11 includes a first semiconductor substrate 21, a first interlayer insulating film 22, a gate insulating film 23 and a gate electrode 24 of each transistor, an insulating film 25, and an insulating film 26. The insulating film 25 is an example of a first insulating film of the present disclosure, and the insulating film 26 is an example of a second insulating film of the present disclosure. The first semiconductor substrate 21 includes a plurality of n type semiconductor regions 21a, a p+ type semiconductor region 21b, a p type semiconductor region 21c, a plurality of n type semiconductor regions 21d, and a plurality of n type semiconductor regions 21e.

The intermediate substrate 12 includes a second semiconductor substrate 31, a second interlayer insulating film 32, a gate insulating films 33 and a gate electrode 34 of each transistor, a plurality of plugs 35, a first wiring layer 36, a second wiring layer 37, a third wiring layer 38, and a third wiring layer 39. The second semiconductor substrate 31 includes a plurality of impurity semiconductor regions 31a. The second interlayer insulating film 32 includes an insulating film 32a and an insulating film 32b.

The lower substrate 13 includes a third semiconductor substrate 41, a third interlayer insulating film 42, a gate insulating film 43 and a gate electrode 44 of each transistor, a plurality of plugs 45, a fifth wiring layer 46, a wiring layer 47, and a seventh wiring layer 48. The third semiconductor substrate 41 includes a plurality of impurity semiconductor regions 41a. The third interlayer insulating film 42 includes an insulating film 42a and an insulating film 42b.

Moreover, the solid-state imaging device of the present embodiment includes a photodiode PD in each of the pixels 1, a vertical gate electrode VG in each of the pixels 1, a pixel separation groove T1 between the pixels 1, and a pixel separation groove T2 between the pixels 1. The two photodiodes PD illustrated in FIG. 2 are examples of first and second photoelectric conversion units of the present disclosure. The pixel separation groove T1 is an example of a first pixel separation groove of the present disclosure, and the pixel separation groove T2 is an example of a second pixel separation groove of the present disclosure.

Hereinafter, the structure of the solid-state imaging device of the present embodiment will be described with reference to FIG. 2.

The upper substrate 11 is stacked on the intermediate substrate 12. The intermediate substrate 12 is stacked on the lower substrate 13. FIG. 2 illustrates a bonding surface S1 between the upper substrate 11 and the intermediate substrate 12 and a bonding surface S2 between the intermediate substrate 12 and the lower substrate 13. The light shielding film 14, the planarization film 15, the color filter 16, and the on-chip lens 17 are sequentially formed on the upper substrate 11. Details of the light shielding film 14, the planarization film 15, the color filter 16, and the on-chip lens 17 will be described later.

The first semiconductor substrate 21 is, for example, a silicon substrate. In FIG. 2, a surface (lower surface) of the first semiconductor substrate 21 in the −Z direction is a front surface of the first semiconductor substrate 21, and a surface (upper surface) of the first semiconductor substrate 21 in the +Z direction is a back surface of the first semiconductor substrate 21. Since the solid-state imaging device of the present embodiment is of a back-illuminated type, the back surface of the first semiconductor substrate 21 is a light incident surface (light reception surface) of the first semiconductor substrate 21.

The first semiconductor substrate 21 includes an impurity semiconductor region such as the n type semiconductor region 21a. The p+ type semiconductor region 21b is provided around the n type semiconductor region 21a. The p type semiconductor region 21c is provided under the p+ type semiconductor region 21b. The n type semiconductor region 21d and the n type semiconductor region 21e are provided under the p type semiconductor region 21c.

The photodiode PD is provided for each of the pixels 1 in the first semiconductor substrate 21. Each of the photodiodes PD is formed by a pn junction or the like between the n type semiconductor region 21a and the p+ type semiconductor region 21b. Each of the photodiodes PD functions as the photoelectric conversion unit that converts light into a charge. Specifically, each of the photodiodes PD receives light from the back surface of the first semiconductor substrate 21, generates a signal charge corresponding to the amount of the received light, and accumulates the generated signal charge in the n type semiconductor region 21a.

The first interlayer insulating film 22 is provided on a surface on the opposite side of the light incident surface of the first semiconductor substrate 21. Examples of the first interlayer insulating film 22 include a silicon oxide film and a laminated film including a silicon oxide film and other insulating films.

The gate insulating film 23 and the gate electrode 24 of each transistor in the upper substrate 11 are sequentially provided under the first semiconductor substrate 21. FIG. 2 illustrates the gate insulating films 23 and the gate electrodes 24 of two transistors. These transistors are, for example, transfer transistors. The gate insulating film 23 and the gate electrode 24 include a portion that is provided outside the first semiconductor substrate 21 and covered with the first interlayer insulating film 22, and a portion provided in the first semiconductor substrate 21. The gate electrode 24 in the first semiconductor substrate 21 is referred to as the vertical gate electrode VG. The vertical gate electrode VG is provided in the p type semiconductor region 21c, the p+ type semiconductor region 21b, and the n type semiconductor region 21a. These transistors are examples of first and second transfer transistors of the present disclosure.

The insulating film 25 is embedded in the pixel separation groove T1 provided in the first semiconductor substrate 21. Therefore, the photodiodes PD can be separated from each other by the insulating film 25. Examples of the insulating film 25 include a silicon oxide film and a laminated film including a silicon oxide film and other insulating films. Here, it is assumed that a groove (trench) for a semiconductor substrate is provided even in a case where the pixel separation groove is filled with a material different from the semiconductor substrate.

The pixel separation groove T1 is a non-through groove provided between the photodiodes PD so as not to penetrate through the first semiconductor substrate 21. The pixel separation groove T1 is provided on the back surface (upper surface) of the first semiconductor substrate 21, and does not reach the front surface (lower surface) of the first semiconductor substrate 21. As described later, the pixel separation groove T1 of the present embodiment is provided among four photodiodes PD adjacent to each other, and has a cross shape in a plan view (see FIG. 4). The pixel separation groove T1 illustrated in FIG. 2 is provided between the two photodiodes PD illustrated in FIG. 2. The pixel separation groove T1 includes only the insulating film 25 in the present embodiment, but may further include a light shielding film in the insulating film 25.

The insulating film 26 is embedded in the pixel separation groove T2 provided in the first semiconductor substrate 21. Therefore, the photodiodes PD can be separated from each other by the insulating film 26. Examples of the insulating film 26 include a silicon oxide film and a laminated film including a silicon oxide film and other insulating films.

The pixel separation groove T2 is a through groove provided between the photodiodes PD so as to penetrate through the first semiconductor substrate 21. The pixel separation groove T2 penetrates between the front surface (upper surface) and the back surface (lower surface) of the first semiconductor substrate 21. As described later, the pixel separation groove T2 of the present embodiment has a shape that surrounds the plurality of photodiodes PD in the first semiconductor substrate 21 for every four photodiodes PD in a plan view (see FIG. 4). Therefore, the pixel separation groove T1 and the pixel separation groove T2 of the present embodiment form a pixel separation groove that surrounds the plurality of photodiodes PD in the first semiconductor substrate 21 in a plan view for each of the photodiodes PD (see FIG. 4). The pixel separation groove T2 illustrated in FIG. 2 surrounds the two photodiodes PD illustrated in FIG. 2 in a plan view. Note that the number N (N is an integer of two or more) of photodiodes PD surrounded by the pixel separation groove T2 may be other than four. The pixel separation groove T2 includes only the insulating film 26 in the present embodiment, but may further include a light shielding film in the insulating film 26.

The second semiconductor substrate 31 is, for example, a silicon substrate. In FIG. 2, a surface (lower surface) of the second semiconductor substrate 31 in the −Z direction is a front surface of the second semiconductor substrate 31, and a surface (upper surface) of the second semiconductor substrate 31 in the +Z direction is a back surface of the second semiconductor substrate 31. The second semiconductor substrate 31 of the present embodiment is provided under the first interlayer insulating film 22 in a state where the upper surface of the second semiconductor substrate 31 is bonded to the lower surface of the first interlayer insulating film 22.

The second interlayer insulating film 32 includes the insulating film 32a provided under the second semiconductor substrate 31 and the insulating film 32b provided under the insulating film 32a. Examples of the insulating film 32a include a silicon oxide film and a laminated film including a silicon oxide film and other insulating films. Similarly, examples of the insulating film 32b is a silicon oxide film or a laminated film including a silicon oxide film and other insulating films.

The gate insulating film 33 and the gate electrode 34 of each transistor in the intermediate substrate 12 are sequentially provided under the second semiconductor substrate 31. FIG. 2 illustrates the gate insulating films 33 and the gate electrodes 34 of two transistors. These transistors are, for example, pixel transistors other than the transfer transistors. The gate insulating film 33 and the gate electrode 34 are provided outside the second semiconductor substrate 31 and covered with the second interlayer insulating film 32. The impurity semiconductor regions 31a in the second semiconductor substrate 31 function as, for example, a source region and a drain region of these transistors.

The plugs 35, the first wiring layer 36, the second wiring layer 37, the third wiring layer 38, and the third wiring layer 39 are provided in the second interlayer insulating film 32. The plugs 35 are provided between the second semiconductor substrate 31 and the first wiring layer 36, between the gate electrode 33 and the first wiring layer 36, between the first wiring layer 36 and the second wiring layer 37, between the second wiring layer 37 and the third wiring layer 38, and between the third wiring layer 38 and the third wiring layer 39, respectively. The first wiring layers 36 to 39 form a first multilayer wiring in the second interlayer insulating film 32. Furthermore, the number of layers of the first multilayer wiring is not limited thereto. Moreover, FIG. 2 illustrates two plugs 35 provided between the first wiring layer 36 and the first semiconductor substrate 21 (n type semiconductor region 21e) in the second interlayer insulating films 32 and 22. Therefore, the upper substrate 11 and the intermediate substrate 12 are electrically connected.

The third semiconductor substrate 41 is, for example, a silicon substrate. In FIG. 2, a surface (upper surface) of the third semiconductor substrate 41 in the +Z direction is a front surface of the third semiconductor substrate 41, and a surface (lower surface) of the third semiconductor substrate 41 in the −Z direction is a back surface of the third semiconductor substrate 41.

The third interlayer insulating film 42 includes the insulating film 42a provided on the third semiconductor substrate 41 and the insulating film 42b provided on the insulating film 42a. Examples of the insulating film 42a include a silicon oxide film and a laminated film including a silicon oxide film and other insulating films. Similarly, examples of the insulating film 42b is a silicon oxide film or a laminated film including a silicon oxide film and other insulating films. The insulating film 42b of the present embodiment is provided under the insulating film 32b in a state where the upper surface of the insulating film 42b is bonded to the lower surface of the insulating film 32b.

The gate insulating film 43 and the gate electrode 44 of each transistor in the lower substrate 13 are sequentially provided on the third semiconductor substrate 41. FIG. 2 illustrates the gate insulating films 43 and the gate electrodes 44 of two transistors. These transistors are, for example, pixel transistors other than the transfer transistors. The gate insulating film 43 and the gate electrode 44 are provided outside the third semiconductor substrate 41 and covered with the third interlayer insulating film 42. The impurity semiconductor regions 41a in the third semiconductor substrate 41 function as, for example, a source region and a drain region of these transistors.

The plugs 45, the fifth wiring layer 46, the sixth wiring layer 47, and the seventh wiring layer 48 are provided in the third interlayer insulating film 42. The plugs 45 are provided between the third semiconductor substrate 41 and the fifth wiring layer 46, between the gate electrode 43 and the fifth wiring layer 46, between the fifth wiring layer 46 and the sixth wiring layer 47, and between the sixth wiring layer 47 and the seventh wiring layer 48, respectively. The fifth to seventh wiring layers 46 to 48 form a second multilayer wiring in the third interlayer insulating film 42. Furthermore, the number of layers of the second multilayer wiring is not limited thereto. The seventh wiring layer 48 of the present embodiment is provided under the third wiring layer 39 in a state where an upper surface of the seventh wiring layer 48 is bonded to the lower surface of the third wiring layer 39. Therefore, the intermediate substrate 12 and the lower substrate 13 are electrically connected.

The light shielding film 14 has an action of shielding light, and is formed on upper surfaces of the insulating films 25 and 26. The light shielding film 14 is, for example, a film containing a metal element such as tungsten (W), aluminum (Al), or copper (Cu).

The planarization film 15 is formed on the first semiconductor substrate 21 with the light shielding film 14 interposed therebetween, whereby a surface above the back surface of the first semiconductor substrate 21 is flat. The planarization film 15 is, for example, an organic film such as a resin film.

The color filter 16 has an action of transmitting light having a predetermined wavelength, and is formed on the planarization film 15 for every predetermined number of pixels 1. For example, the color filters 16 for red (R), green (G), and blue (B) are arranged above the photodiodes PD of the red, green, and blue pixels 1, respectively. Moreover, the color filter 16 for infrared light (IR) may be arranged above the photodiode PD of the pixel 1 for infrared light. The light transmitted through the color filter 16 is incident on the photodiode PD via the planarization film 15. The color filter 16 of the present embodiment is formed for every four pixels 1 on the planarization film 15, and the color filters 16 and the pixels 1 have a one-to-four correspondence.

The on-chip lens 17 has an action of collecting light, and is formed on the color filter 16 for every predetermined number of pixels 1. The light collected by the on-chip lens 17 is incident on the photodiode PD via the color filter 16 and the planarization film 15. The on-chip lens 17 of the present embodiment is formed for every four pixels 1 on the color filter 16, and the on-chip lenses 17 and the pixels 1 have a one-to-four correspondence.

In the present embodiment, light incident on the on-chip lens 17 is collected by the on-chip lens 17, transmitted through the color filter 16, and incident on the photodiode PD. The photodiode PD converts the light into a charge by photoelectric conversion to generate a signal charge. The signal charge is output as a pixel signal via the vertical signal line 8 (FIG. 1) in the first to seventh wiring layers 36 to 39 and 46 to 48.

Figure 3:
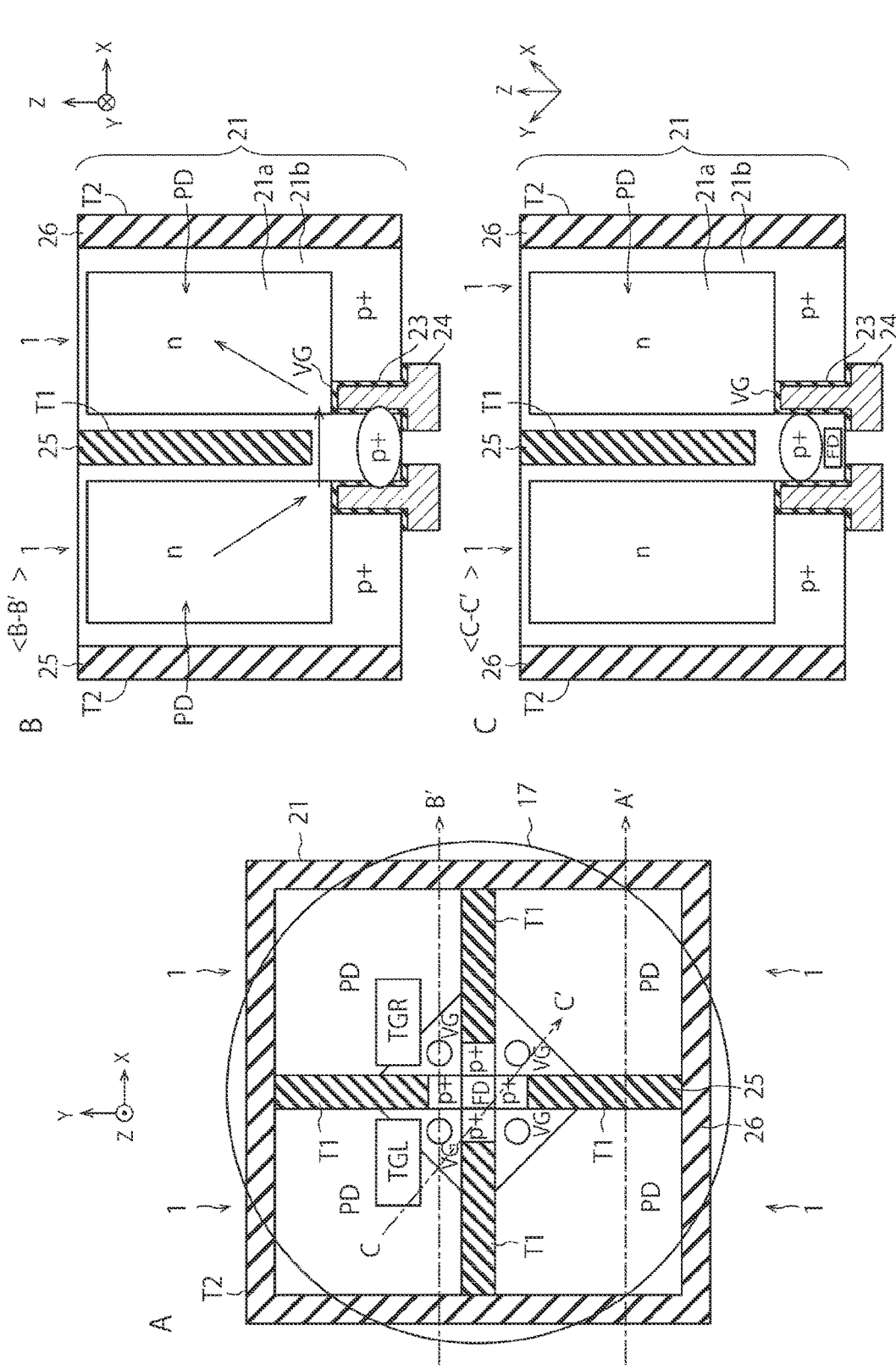
FIG. 3 is a horizontal sectional view and a vertical sectional view illustrating the structure of the solid-state imaging device of the first embodiment.

FIG. 3 is a horizontal sectional view and a vertical sectional view illustrating the structure of the solid-state imaging device of the first embodiment.

A horizontal section of four pixels 1 included in the pixel array region 2 of FIG. 1 is illustrated in A of FIG. 3, and vertical sections of two pixels 1 included in the pixel array region 2 of FIG. 1 are illustrated in B and C of FIG. 3, respectively. A line A-A' extending in the X direction, a line B-B' extending in the X direction, and a line C-C' extending in a direction inclined with respect to the X direction are illustrated in A of FIG. 3. FIG. 2, B of FIG. 3, and C of FIG. 3 illustrate sections taken along the lines B-B', B-B', and C-C' illustrated in A of FIG. 3, respectively. The same XZ section as the XZ section of FIG. 2 is illustrated in B of FIG. 3 in a simplified manner, and the vertical section inclined with respect to the XZ section is illustrated in C of FIG. 3.

A section of the first semiconductor substrate 21, specifically, a section of the photodiodes PD in the four pixels 1 is illustrated in A of FIG. 3. The pixel separation grooves T1 and T2, the insulating films 25 and 26, and the four vertical gate electrodes VG provided in the first semiconductor substrate 21 are illustrated in A of FIG. 3. Moreover, for convenience, the on-chip lens 17 provided on the first semiconductor substrate 21, a floating diffusion unit FD provided under the pixel separation groove T1 in the first semiconductor substrate 21, and a p+ type region around the floating diffusion unit FD are illustrated in A of FIG. 3 in order to facilitate the understanding of the description. Moreover, for convenience, A of FIG. 3 illustrates triangular planar shapes of four transfer transistors, which are provided under the first semiconductor substrate 21 and include the vertical gate electrodes VG around the vertical gate electrode VG, in order to facilitate the understanding of the description. Reference signs TGL and TGR illustrated in A of FIG. 3 indicate an upper left transfer transistor and an upper right transfer transistor, respectively, of the four transfer transistors. The transfer transistors TGL and TGR are examples of the first and second transfer transistors, respectively. The floating diffusion unit FD is provided in the first semiconductor substrate 21 at a position at least partially overlapping the pixel separation groove T1 in a plan view.

The four pixels 1 illustrated in A of FIG. 3 are pixels of the same color. For example, all of the four pixels 1 illustrated in A of FIG. 3 are red (R) pixels. Thus, one on-chip lens 17 is provided on the photodiodes PD of these pixels 1, and these pixels 1 share this on-chip lens 17. Similarly, one color filter 16 is provided on the photodiodes PD of these pixels 1, and these pixels 1 share this color filter 16.

In A of FIG. 3, the pixel separation groove T1 is provided among the four photodiodes PD of the pixels 1, and has a cross shape in a plan view. On the other hand, the pixel separation groove T2 has a shape surrounding the four photodiodes PD. Therefore, the pixel separation groove T1 and the pixel separation groove T2 form the pixel separation groove surrounding the four photodiodes PD for each of the photodiodes PD.

Figure 4:
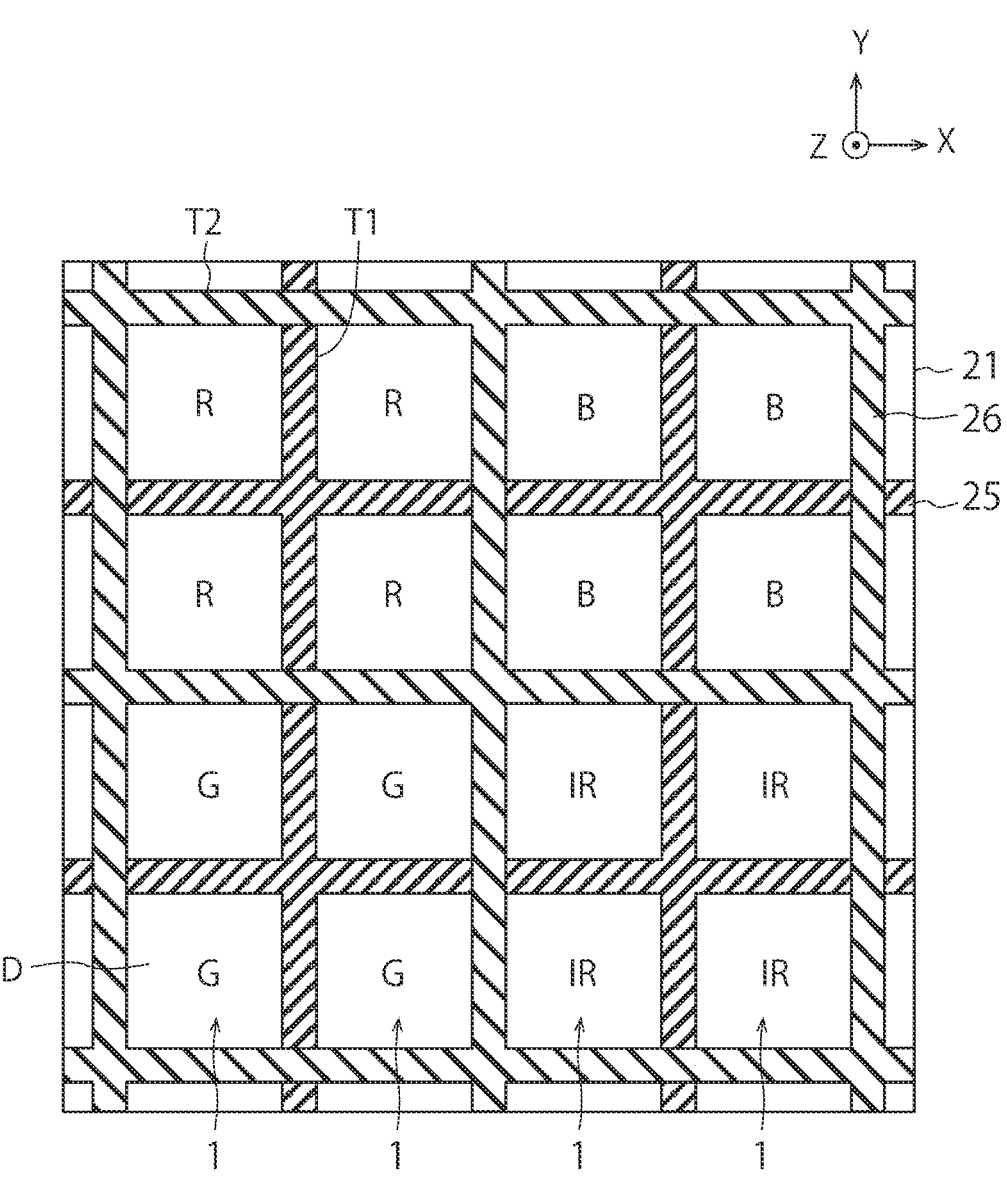
FIG. 4 is a horizontal sectional view illustrating the structure of the solid-state imaging device of the first embodiment.

Note that the pixel separation groove T1 illustrated in A of FIG. 3 seems to be divided into four since the floating diffusion unit FD and the p+ type region are illustrated in A of FIG. 3, but it should be noted that the pixel separation groove T1 has a cross shape illustrated in FIG. 4 to be precise. The shape of the pixel separation groove T1 of the present embodiment is the same in both the section along the line B-B' and the section along the line A-A'.

The pixel separation groove T1 has a cross planar shape, and thus, includes a first portion extending in the X direction and a second portion extending in the Y direction, and the floating diffusion unit FD is provided under an intersection portion between the first portion and the second portion in the first semiconductor substrate 21 (see C of FIG. 3). The X direction and the Y direction are examples of first and second directions of the present disclosure, respectively. The floating diffusion unit FD of the present embodiment is shared by the four pixels 1 illustrated in A of FIG. 3.

The floating diffusion unit FD is, for example, an n+ type semiconductor region provided under the p type semiconductor region 21c in the first semiconductor substrate 21. In A of FIG. 3, the floating diffusion unit FD is used to accumulate the signal charge generated by the each of the photodiodes PD illustrated in A of FIG. 3. Furthermore, each of the transfer transistors illustrated in FIG. 3 has a function of transferring the signal charge from the photodiode PD located on the transfer transistor to the floating diffusion unit FD.

The signal charge can also be transferred and received between the two photodiodes PD illustrated in A of FIG. 3. For example, the transfer transistors TGL and TGR can perform transfer of the signal charge generated by the photodiode PD located on the transfer transistor TGL to the photodiode PD located on the transfer transistor TGR via a region under the pixel separation groove T1 in the first semiconductor substrate 21 (see B of FIG. 3). Note that further details of the transfer of the signal charge will be described later.

Two photodiodes PD and the vertical gate electrodes VG of the two transfer transistors under these photodiodes PD are illustrated in B of FIG. 3. The left and right transfer transistors illustrated in B of FIG. 3 are the above-described transfer transistors TGL and TGR, respectively. The pixel separation groove T1 between these photodiodes PD is the non-through groove. Therefore, the transfer transistors TGL and TGR can perform transfer of the signal charge generated by the photodiode PD located on the transfer transistor TGL to the photodiode PD located on the transfer transistor TGR via a region under the pixel separation groove T1 in the first semiconductor substrate 21. Arrows illustrated in B of FIG. 3 indicate such transfer of the signal charge.

The solid-state imaging device of the present embodiment can operate to obtain a high dynamic range by making signal charge accumulation times different among the four pixels 1 (pixels of the same color) illustrated in A of FIG. 3. In this case, if the pixel separation groove among these pixels 1 is not a through groove but a non-through groove, the signal charge moves (overflows) among the pixels 1, and thus, there is a possibility that it is difficult to obtain the high dynamic range. Since the pixel separation groove among these pixels 1 of the present embodiment is the pixel separation groove T1 which is the non-through groove, such a problem may occur.

On the other hand, if the pixel separation groove among these pixels 1 of the present embodiment is formed as a through groove, it becomes difficult to obtain an advantage of the overflow of the signal charge. Specifically, if it is difficult for the signal charge to move (overflow) among these pixels 1, linearity collapses at an end of the pixel 1, and a point defect occurs.

Therefore, the pixel separation groove among the four pixels 1 illustrated in A of FIG. 3 is the pixel separation groove T1 which is the non-through groove in the present embodiment. Therefore, the signal charge can move (overflow) among these pixels 1, it is possible to suppress the collapse of the linearity at the end of the pixel 1, and it is possible to suppress the occurrence of the point defect. On the other hand, the problem that it is difficult to obtain the high dynamic range due to the overflow of the signal charge can be suppressed by, for example, making the pixel separation groove T1 sufficiently deep or closing an overflow path by the operation of the transfer transistor. Therefore, it is possible to widen a light amount range in which a phase difference can be acquired. In this manner, it is possible to obtain both an advantage of the through groove and an advantage of the non-through groove according to the present embodiment. Note that further details of the closing of the overflow path will be described later.

FIG. 4 is a horizontal sectional view illustrating a structure of the solid-state imaging device of the first embodiment.

FIG. 4 illustrates the same XY section as the XY section in A of FIG. 3. However, A of FIG. 3 illustrates four pixels 1 included in the pixel array region 2 of FIG. 1, whereas FIG. 4 illustrates sixteen pixels 1 included in the pixel array region 2 of FIG. 1.

The sixteen pixels 1 illustrated in FIG. 4 include four red (R) pixels, four green (G) pixels, four blue (B) pixels, and four infrared light (IR) pixels. The pixel separation groove T2 surrounds the photodiodes PD of the pixels 1 for every four photodiodes PD in a plan view. Specifically, the pixel separation groove T2 illustrated in FIG. 4 includes a portion surrounding the photodiodes PD of the four red pixels, a portion surrounding the photodiodes PD of the four green pixels, a portion surrounding the photodiodes PD of the four blue pixels, and a portion surrounding the photodiodes PD of the four infrared light pixels. Thus, these photodiodes PD are surrounded for every pixel of the same color. The four pixels 1 of each color have the structure described with reference to A of FIG. 3.

In the present embodiment, the pixels 1 of different colors are separated by the pixel separation groove T2 (through groove), crosstalk between these pixels 1 can be effectively suppressed.

Next, three operation modes of the solid-state imaging device of the present embodiment will be described with reference to FIGS. 5 to 7.

Figure 5:
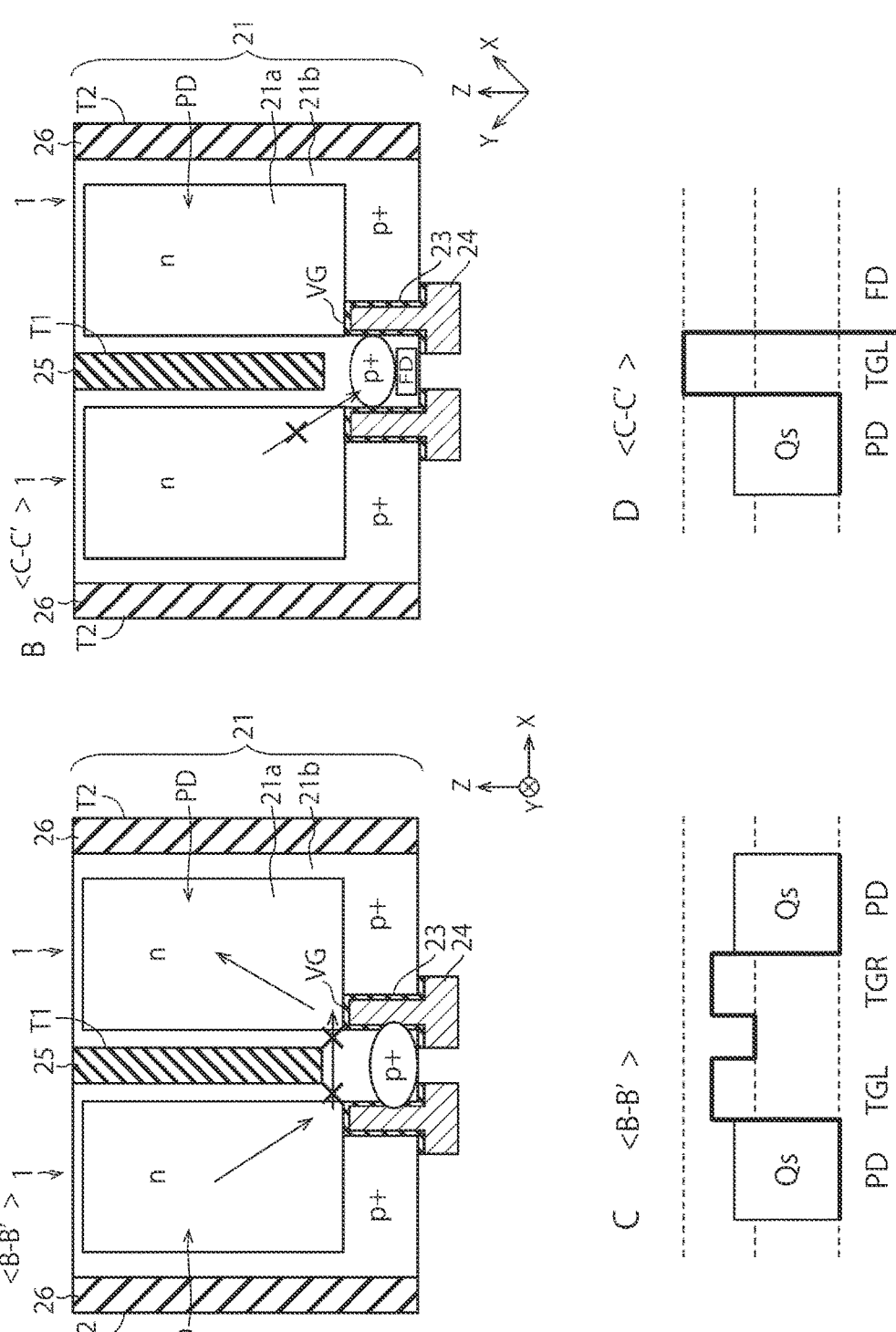
FIG. 5 is a vertical sectional view and a graph for describing an operation in a first mode of the solid-state imaging device of the first embodiment.

FIG. 5 is a vertical sectional view and a graph for describing an operation in a first mode of the solid-state imaging device of the first embodiment.

A section taken along the line B-B' similarly to B of FIG. 3 is illustrated in A of FIG. 5, and a section taken along the line C-C' similarly to C of FIG. 3 is illustrated in B of FIG. 5. Furthermore, C of FIG. 5 illustrates a profile of potentials in a section taken along the line B-B', and D of FIG. 5 illustrates a profile of potentials in a section taken along the line C-C'.

The transfer transistors TGL and TGR in the first mode operate to close a charge path from the photodiode PD located on the transfer transistor TGL to the photodiode PD located on the transfer transistor TGR (A of FIG. 5). Therefore, it is possible to suppress the overflow of the signal charge between these photodiodes PD. Moreover, the transfer transistor TGL in the first mode further operates to close a charge path from the photodiode PD located on the transfer transistor TGL to the floating diffusion unit FD (B of FIG. 5).

In the first mode, potentials at positions of the transfer transistors TGL and TGR are set high (C and D in FIG. 5). Therefore, it is possible to suppress the signal charge (Qs) from moving between the photodiode PD on the transfer transistor TGL and the photodiode PD on the transfer transistor TGR (C of FIG. 5). Moreover, it is possible to suppress the signal charge from moving from the photodiode PD on the transfer transistor TGL to the floating diffusion unit FD (D of FIG. 5).

According to the first mode, it is possible to achieve the operation similar to that in the case where the pixel separation groove T1 is replaced with a through groove. The first mode can be used, for example, in a case where it is desired to widen the light amount range in which the phase difference can be acquired. According to the first mode, for example, the phase difference can be acquired when the light amount is large.

Figure 6:
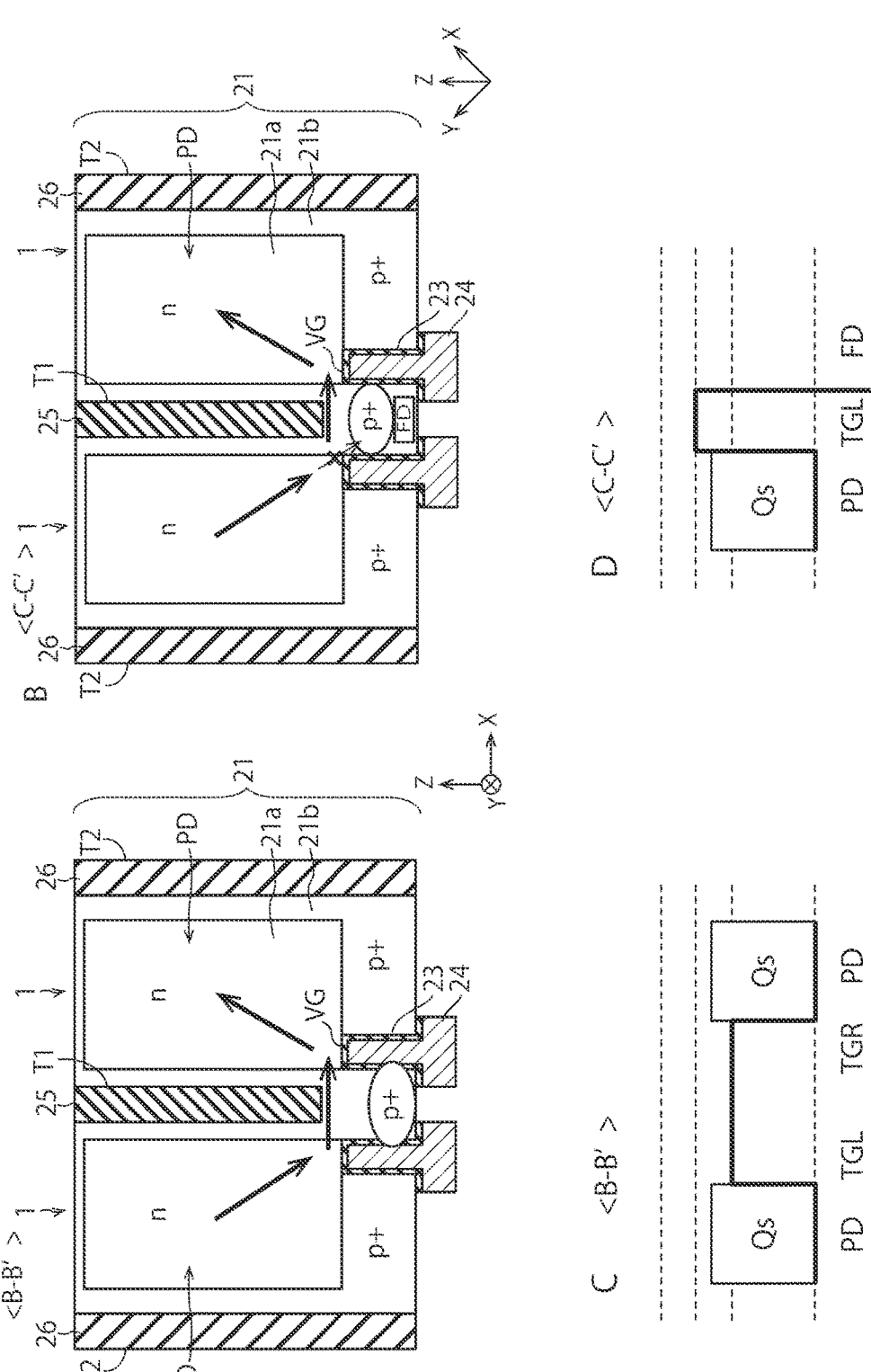
FIG. 6 is a vertical sectional view and a graph for describing an operation in a second mode of the solid-state imaging device of the first embodiment.

FIG. 6 is a vertical sectional view and a graph for describing an operation in a second mode of the solid-state imaging device of the first embodiment.

A section taken along the line B-B' similarly to B of FIG. 3 is illustrated in A of FIG. 6, and a section taken along the line C-C' similarly to C of FIG. 3 is illustrated in B of FIG. 6. Furthermore, C of FIG. 6 illustrates a profile of potentials in a section taken along the line B-B', and D of FIG. 6 illustrates a profile of potentials in a section taken along the line C-C'.

The transfer transistors TGL and TGR in the second mode operate to open the charge path from the photodiode PD located on the transfer transistor TGL to the photodiode PD located on the transfer transistor TGR (A of FIG. 6). Therefore, it is possible to make the signal charge overflow between these photodiodes PD. Moreover, the transfer transistor TGL in the second mode further operates to close the charge path from the photodiode PD located on the transfer transistor TGL to the floating diffusion unit FD (B of FIG. 6).

In the second mode, potentials at the positions of the transfer transistors TGL and TGR are set lower than those in the first mode (C and D in FIG. 6). Therefore, it is possible to make the signal charge move between the photodiode PD on the transfer transistor TGL and the photodiode PD on the transfer transistor TGR (C of FIG. 6). Moreover, it is possible to suppress the signal charge from moving from the photodiode PD on the transfer transistor TGL to the floating diffusion unit FD (D of FIG. 6).

According to the second mode, it is possible to cause the overflow of the signal charge via a region under the pixel separation groove T1 which is the non-through groove. Therefore, it is possible to suppress the occurrence of the linearity collapse at the end of the pixel 1, and it is possible to suppress the occurrence of the point defect. According to the second mode, for example, the phase difference can be acquired when the light amount is small.

Figure 7:
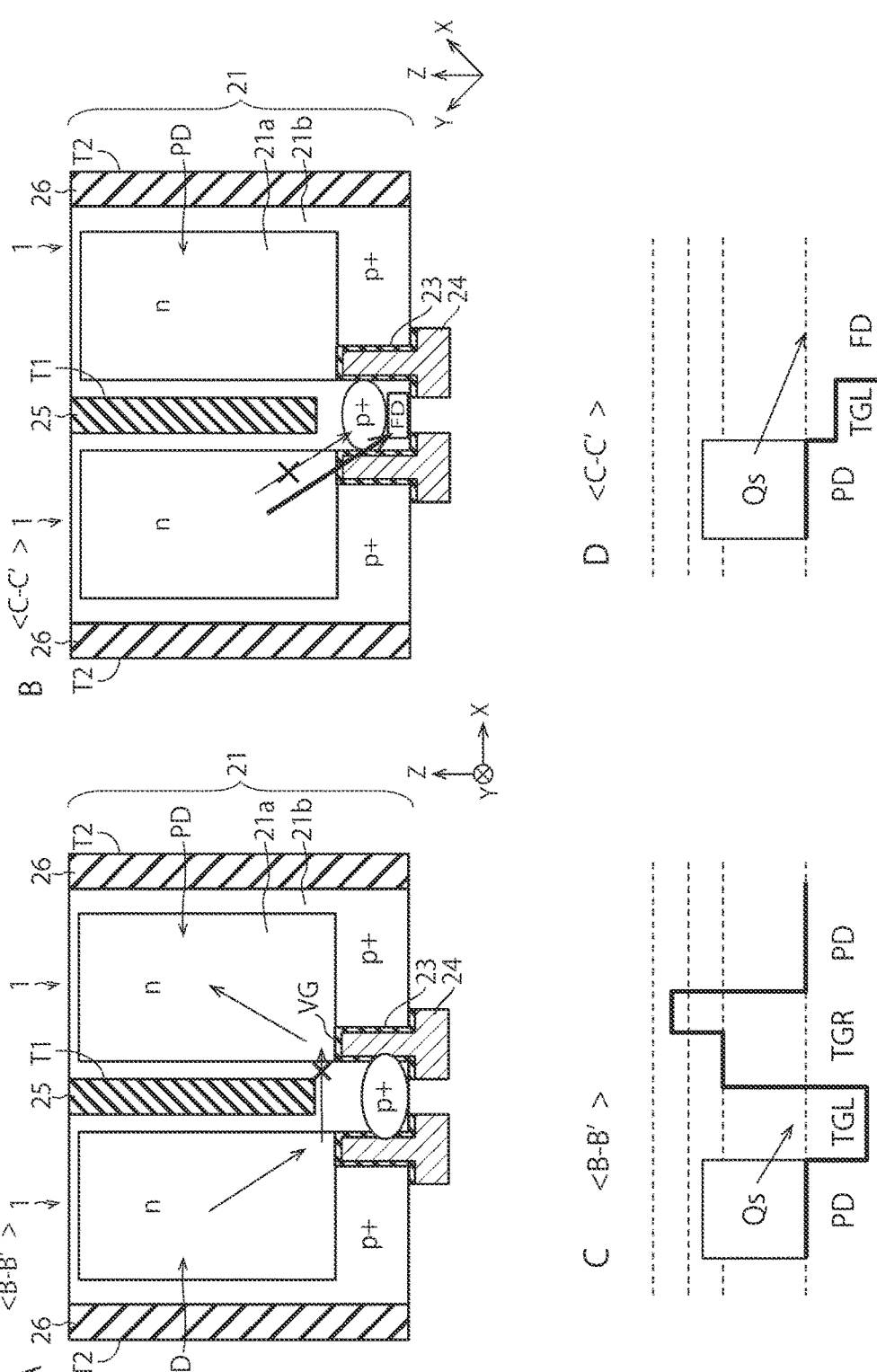
FIG. 7 is a vertical sectional view and a graph for describing an operation in a third mode of the solid-state imaging device of the first embodiment.

FIG. 7 is a vertical sectional view and a graph for describing an operation in a third mode of the solid-state imaging device of the first embodiment.

A section taken along the line B-B' similarly to B of FIG. 3 is illustrated in A of FIG. 7, and a section taken along the line C-C' similarly to C of FIG. 3 is illustrated in B of FIG. 7. Furthermore, C of FIG. 7 illustrates a profile of potentials in a section taken along the line B-B', and D of FIG. 7 illustrates a profile of potentials in a section taken along the line C-C'.

The transfer transistors TGL and TGR in the third mode operate to close a charge path from the photodiode PD located on the transfer transistor TGL to the photodiode PD located on the transfer transistor TGR (A of FIG. 7). Therefore, it is possible to suppress the overflow of the signal charge between these photodiodes PD. Moreover, the transfer transistor TGL in the third mode further operates to open the charge path from the photodiode PD located on the transfer transistor TGL to the floating diffusion unit FD (B of FIG. 7). Therefore, the signal charge generated by the photodiode PD can be accumulated in the floating diffusion unit FD.

In the first mode and the second mode, the potentials at the positions of the transfer transistors TGL and TGR are set higher than potentials at positions of the photodiode PD thereon (C and D in FIG. 5 and C and D in FIG. 6). On the other hand, in the third mode, the potential at the position of the transfer transistor TGL is set lower than the potential at the position of the photodiode PD, and the potential at the position of the transfer transistor TGR is set higher than the potential at the position of the photodiode PD (C and D in FIG. 7). Therefore, it is possible to suppress the signal charge from moving between the photodiode PD on the transfer transistor TGL and the photodiode PD on the transfer transistor TGR (C of FIG. 7). Moreover, it is possible to make the signal charge move from the photodiode PD on the transfer transistor TGL to the floating diffusion unit FD (D of FIG. 7).

According to the third mode, it is possible to transfer the signal charge from the photodiode PD to the floating diffusion unit FD via the region under the pixel separation groove T1 which is the non-through groove.

Note that the contents described with reference to A and C of FIG. 5, A and C of FIG. 6, and A and C of FIG. 7 are also applicable to the pair of two transfer transistors other than the pair of transfer transistors TGL and TRG among the four transfer transistors illustrated in A of FIG. 3.

Furthermore, the contents described with reference to B and D of FIG. 5, B and D of FIG. 6, and B and D of FIG. 7 are also applicable to the transfer transistors other than the transfer transistor TGL among the four transfer transistors illustrated in A of FIG. 3.

As described above, the pixel separation groove in the first semiconductor substrate 21 of the present embodiment includes the pixel separation groove T1 which is the non-through groove and the pixel separation groove T2 which is the through groove. Thus, it is possible to form the pixel separation groove having a suitable action in the first semiconductor substrate 21 according to the present embodiment. For example, the advantage of the non-through groove can be obtained by the pixel separation groove T1, and the advantage of the through groove can be obtained by the pixel separation groove T2. Furthermore, when the control as illustrated in FIGS. 5 to 7, for example, is adopted, it is possible to obtain an effect obtained as the pixel separation groove T1 is the non-through groove and an effect similar to that in the case where the pixel separation groove T1 is replaced with the through groove.

Second Embodiment

Figure 8:
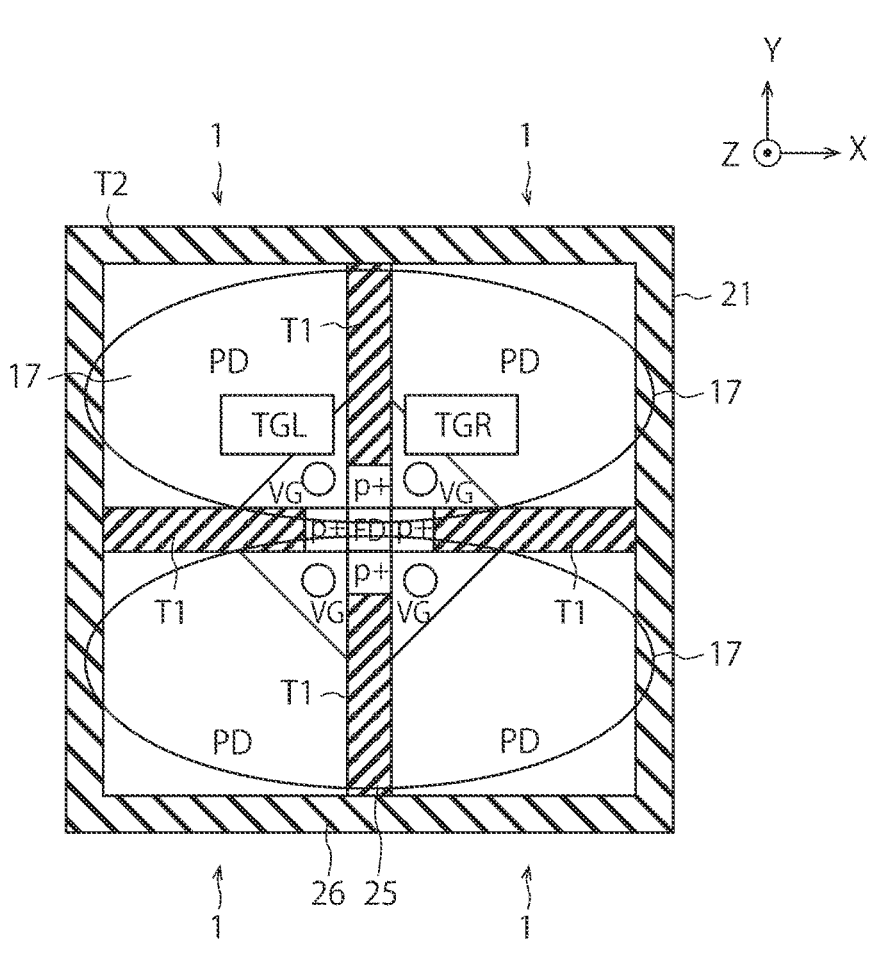
FIG. 8 is a horizontal sectional view illustrating a structure of a solid-state imaging device of a second embodiment.

FIG. 8 is a horizontal sectional view illustrating a structure of a solid-state imaging device of a second embodiment.

FIG. 8 illustrates a horizontal section of four pixels 1 similarly to A of FIG. 3. These pixels 1 are, for example, pixels of the same color. The solid-state imaging device in FIG. 8 has substantially the same structure as the solid-state imaging device in A of FIG. 3. However, four photodiodes PD illustrated in FIG. 8 are provided under two on-chip lenses 17 extending in the X direction, and the on-chip lenses 17 and the photodiodes PD have a one-to-two correspondence. Note that color filters 16 and the photodiodes PD of the present embodiment may have a one-to-two correspondence, or may have a one-to-four correspondence.

According to the present embodiment, it is possible to arrange a larger number of smaller on-chip lenses 17 as compared with the first embodiment, and thus, it is possible to finely control an optical path by the on-chip lenses 17, for example. On the other hand, according to the first embodiment, the on-chip lens 17 can be easily formed, for example, as compared with the present embodiment.

Figure 9:
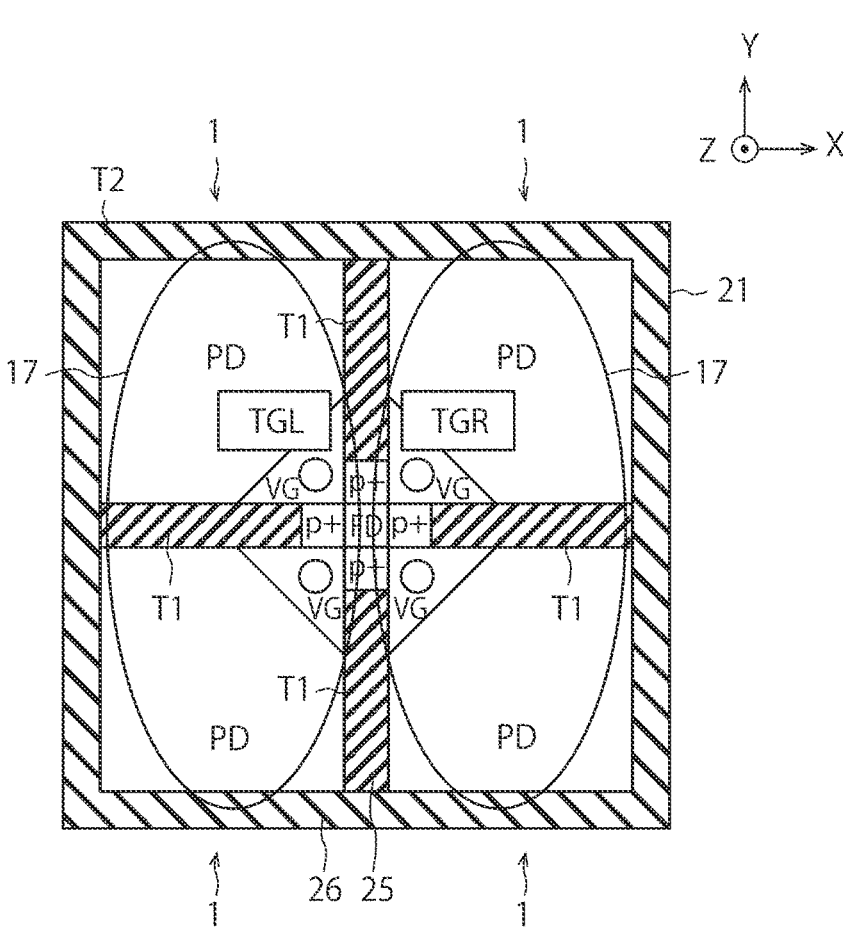
FIG. 9 is a horizontal sectional view illustrating a structure of a solid-state imaging device of a modified example of the second embodiment.

FIG. 9 is a horizontal sectional view illustrating a structure of a solid-state imaging device of a modified example of the second embodiment.

FIG. 9 also illustrates a horizontal section of four pixels 1. Four photodiodes PD illustrated in FIG. 9 are provided under two on-chip lenses 17 extending in the Y direction, and the on-chip lenses 17 and the photodiodes PD have a one-to-two correspondence. In this manner, the on-chip lens 17 of the present embodiment may extend in the X direction or the Y direction.

Figure 10:
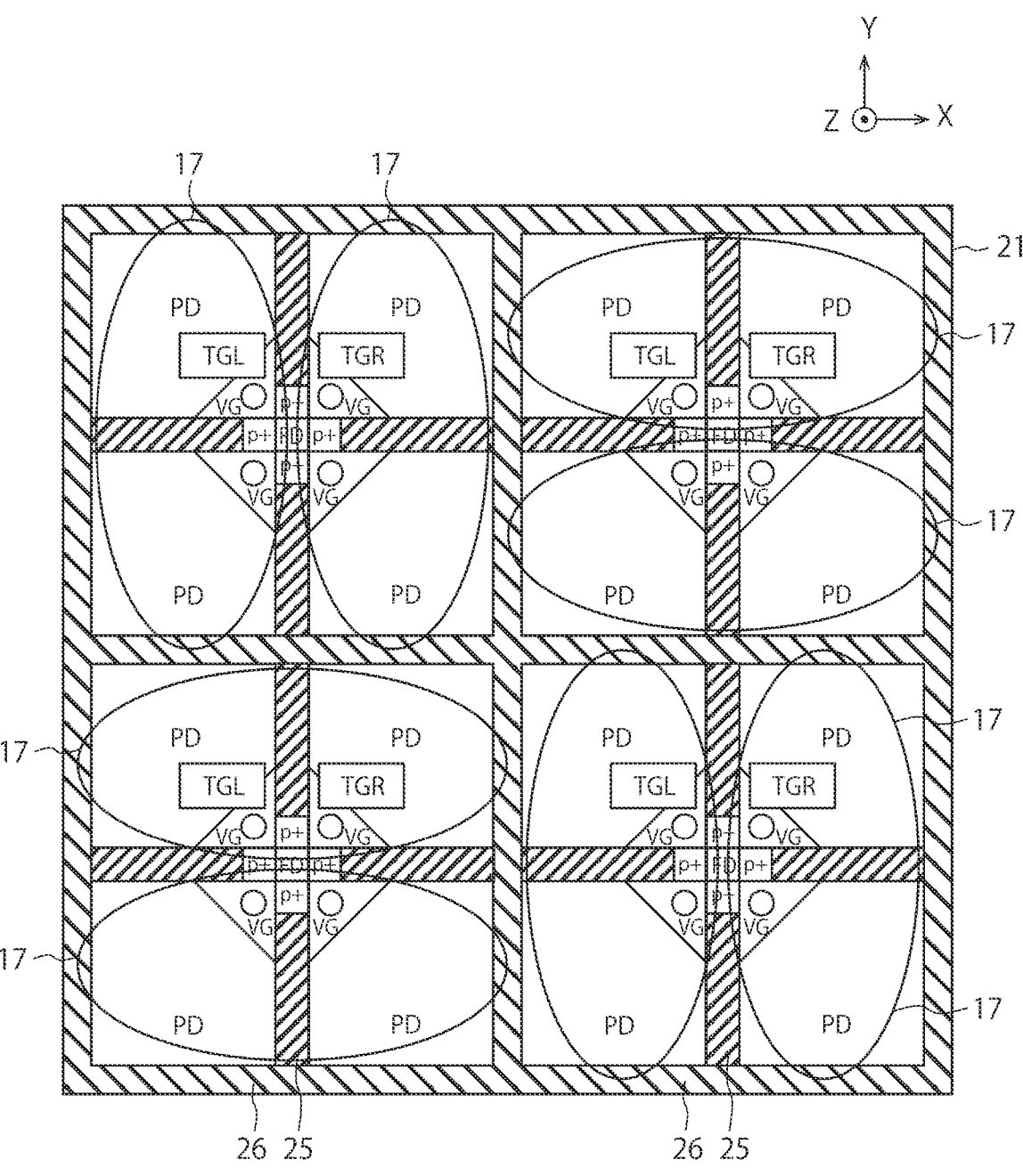
FIG. 10 is a horizontal sectional view illustrating a structure of a solid-state imaging device of another modified example of the second embodiment.

FIG. 10 is a horizontal sectional view illustrating a structure of a solid-state imaging device of another modified example of the second embodiment.

FIG. 10 illustrates a horizontal section of sixteen pixels 1 similarly to FIG. 4. In the solid-state imaging device in FIG. 10 as well, the on-chip lenses 17 and the photodiodes PD have a one-to-two correspondence. However, the solid-state imaging device in FIG. 10 includes both the on-chip lens 17 extending in the X direction and the on-chip lens 17 extending in the Y direction. In this manner, the on-chip lenses 17 of the present embodiment may include the on-chip lens 17 extending in the X direction and the on-chip lens 17 extending in the Y direction.

Third Embodiment

Figure 11:
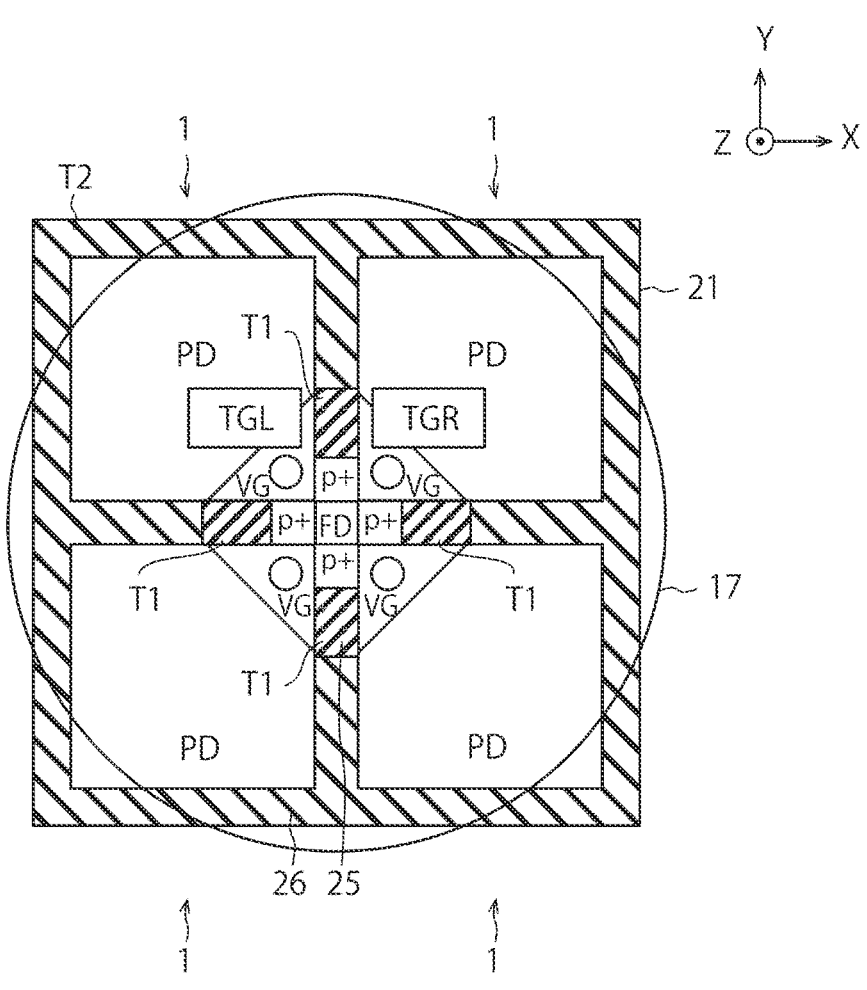
FIG. 11 is a horizontal sectional view illustrating a structure of a solid-state imaging device of a third embodiment.

FIG. 11 is a horizontal sectional view illustrating a structure of a solid-state imaging device of a third embodiment.

FIG. 11 illustrates a horizontal section of four pixels 1 similarly to A of FIG. 3 and the like. These pixels 1 are, for example, pixels of the same color. The solid-state imaging device in FIG. 11 has substantially the same structure as the solid-state imaging device in A of FIG. 3. However, a pixel separation groove T2 illustrated in FIG. 11 not only surrounds four photodiodes PD in a plan view, but also is provided among these photodiodes PD together with a pixel separation groove T1. Thus, the photodiodes PD illustrated in FIG. 11 are separated from each other by the pixel separation groove T1 and the pixel separation groove T2.

According to the present embodiment, a proportion of a through groove (the pixel separation groove T2) to the entire pixel separation groove can be increased, and thus, it is possible to more strongly obtain an advantage of the through groove, for example. On the other hand, according to the first embodiment, the pixel separation groove T1 and the pixel separation groove T2 can be prevented from being mixed between the same color pixels, and thus, the pixel separation grooves T1 and T2 can be easily formed, for example.

Fourth Embodiment

Figure 12:
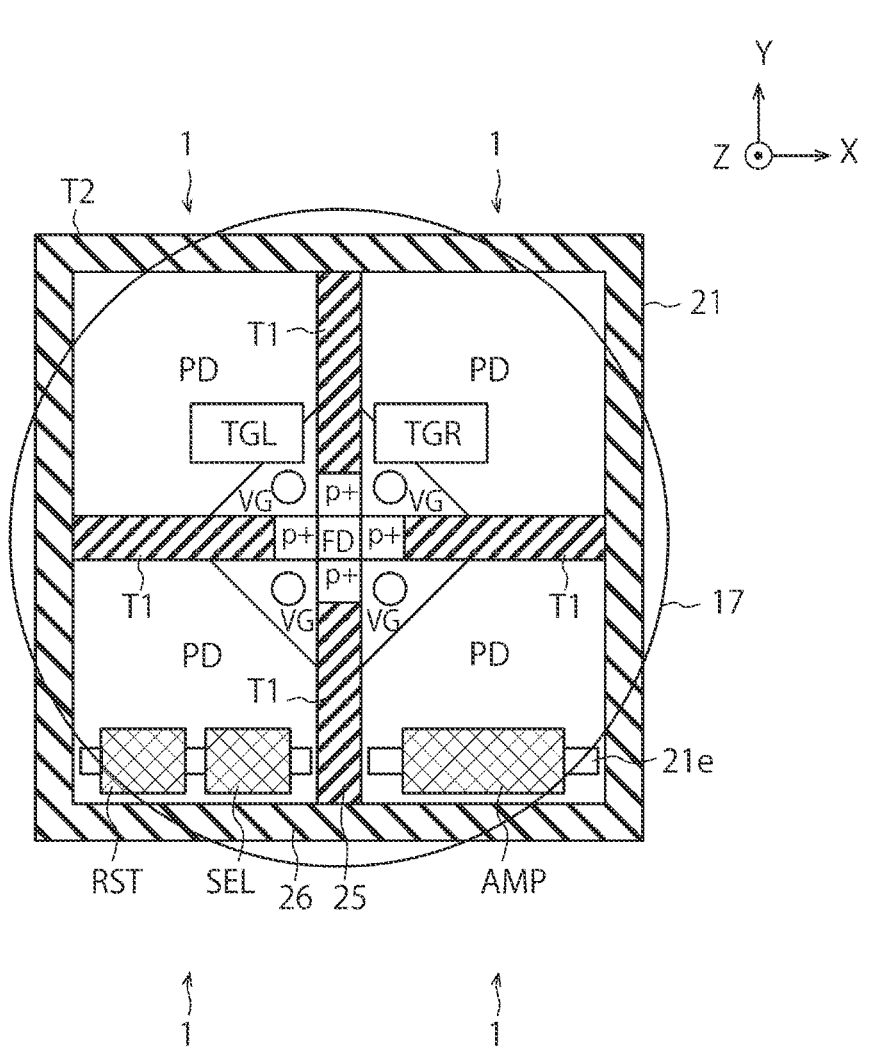
FIG. 12 is a horizontal sectional view illustrating a structure of a solid-state imaging device of a fourth embodiment.

FIG. 12 is a horizontal sectional view illustrating a structure of a solid-state imaging device of a fourth embodiment.

FIG. 12 illustrates a horizontal section of four pixels 1 similarly to A of FIG. 3 and the like. These pixels 1 are, for example, pixels of the same color. The solid-state imaging device in FIG. 12 has substantially the same structure as the solid-state imaging device in A of FIG. 3. However, the solid-state imaging device in FIG. 12 includes not only transfer transistors such as TGL and TGR but also a reset transistor RST, a selection transistor SEL, and an amplification transistor AMP on a front surface (lower surface) of a first semiconductor substrate 21. That is, all of these transistors are provided on the surface opposite to a light incident surface of the first semiconductor substrate 21. In this manner, the reset transistor RST, the selection transistor SEL, and the amplification transistor AMP of the present embodiment may be provided in an upper substrate 11 instead of being provided in a lower substrate 13 or an intermediate substrate 12 (see FIG. 2). Note that the solid-state imaging device of the present embodiment does not necessarily include at least one of the lower substrate 13 or the intermediate substrate 12.

Fifth Embodiment

Figure 13:
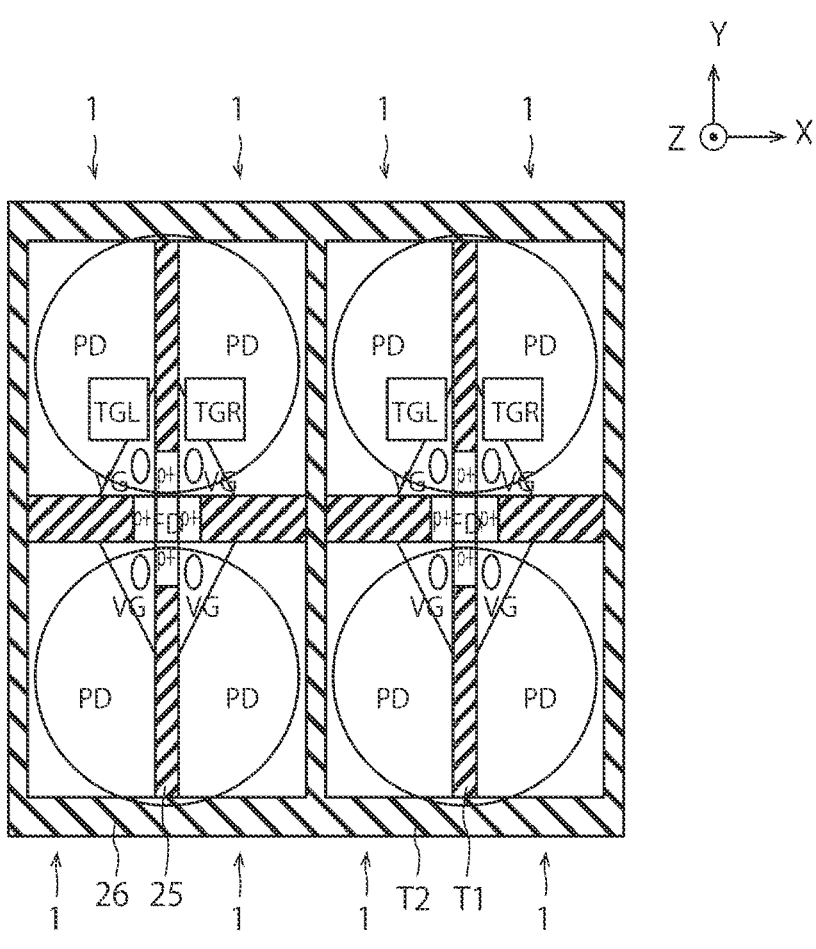
FIG. 13 is a horizontal sectional view illustrating a structure of a solid-state imaging device of a fifth embodiment.

FIG. 13 is a horizontal sectional view illustrating a structure of a solid-state imaging device of a fifth embodiment.

FIG. 13 also illustrates a horizontal section of eight pixels 1. In the solid-state imaging device illustrated in FIG. 13, on-chip lenses 17 and photodiodes PD have a one-to-two correspondence similarly to the solid-state imaging device illustrated in FIG. 8. However, in the solid-state imaging device illustrated in FIG. 13, a planar shape of the on-chip lens 17 is a circle, and a planar shape of the photodiode PD is a rectangle. Note that the eight pixels 1 illustrated in FIG. 13 may include eight pixels of the same color, or may include four pixels of a certain color and four pixels of another color.

According to the present embodiment, the solid-state imaging device having a structure similar to that of the solid-state imaging device of the second embodiment can be achieved by elongating the planar shape of the photodiode PD instead of elongating the planar shape of the on-chip lens 17. Note that the planar shape of the photodiode PD of the present embodiment may be a rectangle extending in the Y direction or a rectangle extending in the X direction.

Sixth Embodiment

Figure 14:
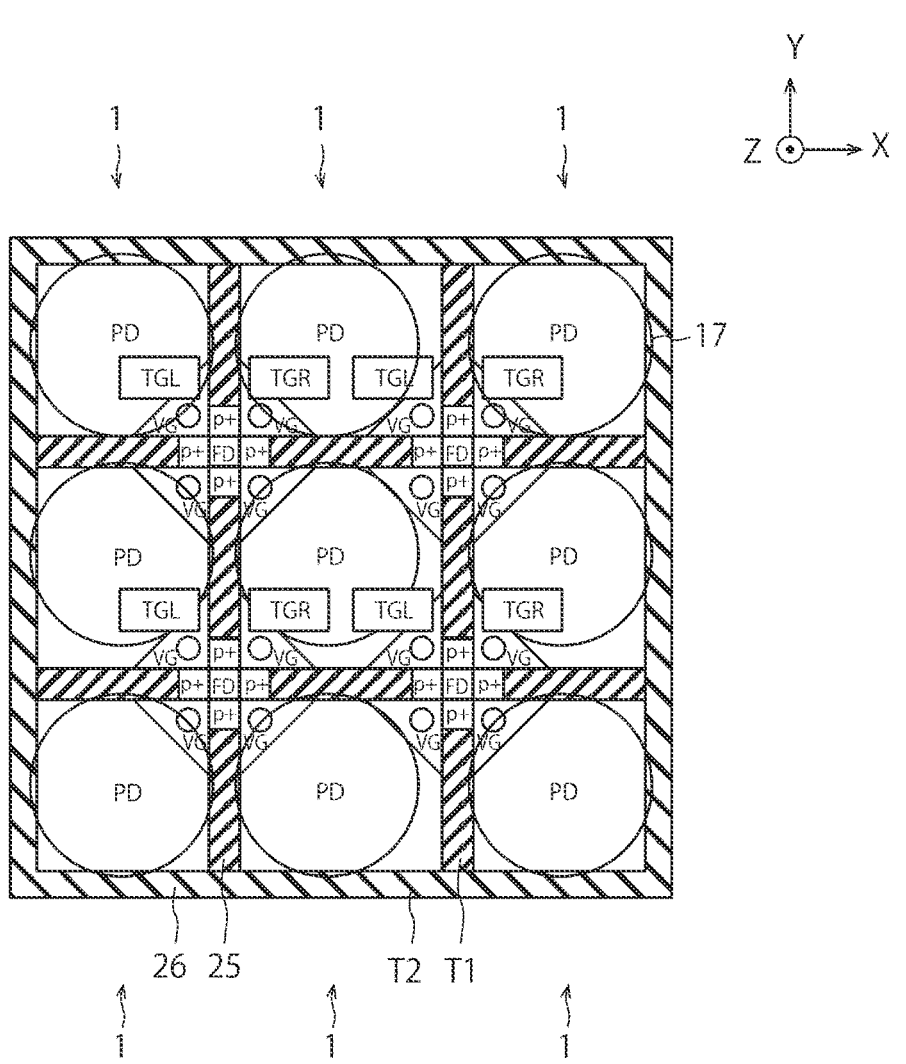
FIG. 14 is a horizontal sectional view illustrating a structure of a solid-state imaging device of a sixth embodiment.

FIG. 14 is a horizontal sectional view illustrating a structure of a solid-state imaging device of a sixth embodiment.

FIG. 14 also illustrates a horizontal section of nine pixels 1. These pixels 1 are, for example, pixels of the same color. A pixel separation groove T2 illustrated in FIG. 14 has a shape that surrounds a plurality of photodiodes PD in a first semiconductor substrate 21 for every nine photodiodes PD in a plan view. On the other hand, a pixel separation groove T1 illustrated in FIG. 14 is provided among these nine photodiodes PD. Thus, the pixel separation groove T1 and the pixel separation groove T2 illustrated in FIG. 14 form a pixel separation groove that surrounds the photodiodes PD in a plan view for each of the photodiodes PD.

The nine photodiodes PD illustrated in FIG. 14 are provided under nine on-chip lenses 17, and the on-chip lenses 17 and the photodiodes PD have a one-to-one correspondence. According to the present embodiment, it is possible to arrange a large number of small on-chip lenses 17 similarly to the second embodiment, and thus, it is possible to finely control an optical path by the on-chip lenses 17, for example. Note that color filters 16 and the photodiodes PD of the present embodiment may have a one-to-one correspondence, or may have a one-to-nine correspondence.

The solid-state imaging device of the present embodiment includes the photodiodes PD surrounded by the pixel separation grooves T2 in units of 3×3 (=9), but may include photodiodes PD surrounded by the pixel separation grooves T2 in units of K×K (K is an integer of four or more) instead.

Seventh Embodiment

Figure 15:
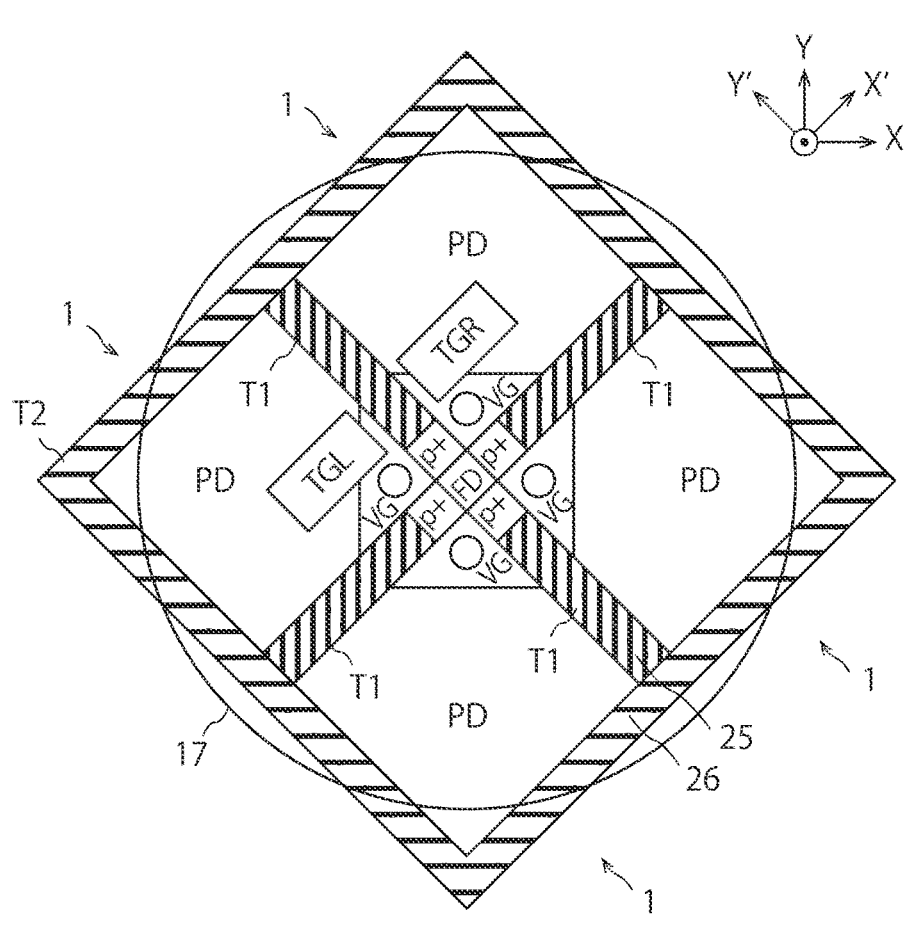
FIG. 15 is a horizontal sectional view illustrating a structure of a solid-state imaging device of a seventh embodiment.

FIG. 15 is a horizontal sectional view illustrating a structure of a solid-state imaging device of a seventh embodiment.

FIG. 15 also illustrates a horizontal section of four pixels 1. These pixels 1 are, for example, pixels of the same color. The solid-state imaging device in FIG. 15 has substantially the same structure as the solid-state imaging device in A of FIG. 3. However, pixel separation grooves T1 and T2 illustrated in FIG. 15 extend in an X' direction and a Y' direction while the pixel separation grooves T1 and T2 illustrated in A of FIG. 3 extend in the X direction and the Y direction. The X' direction is inclined by a predetermined angle with respect to the X direction, and the Y' direction is also inclined by the predetermined angle with respect to the Y direction. Thus, the pixel 1 of the solid-state imaging device in FIG. 15 has a structure obtained by inclining the pixel 1 of the solid-state imaging device in A of FIG. 3 by the predetermined angle. The predetermined angle is, for example, 45 degrees. The X' direction and the Y' direction are examples of the first and second directions of the present disclosure, respectively.

Here, an example of the structure of the solid-state imaging device in A of FIG. 3 and the structure of the solid-state imaging device in FIG. 15 will be described.

In this example, a planar shape of a semiconductor chip including the solid-state imaging device in A of FIG. 3 is a rectangle having two sides extending in the X direction and two sides extending in the Y direction. Similarly, a planar shape of a semiconductor chip including the solid-state imaging device in FIG. 15 is also a rectangle having two sides extending in the X direction and two sides extending in the Y direction. Thus, each of these semiconductor chips has two end surfaces extending in the X direction and two end surfaces extending in the Y direction.

Here, in the solid-state imaging device in A of FIG. 3, the pixel separation grooves T1 and T2 also extend in the X direction and the Y direction. Thus, the pixel separation grooves T1 and T2 illustrated in A of FIG. 3 extend in a direction parallel to the end surface of the semiconductor chip or in a direction perpendicular to the end surface of the semiconductor chip.

On the other hand, in the solid-state imaging device of FIG. 15, the pixel separation grooves T1 and T2 extend in the X' direction and the Y' direction. Thus, the pixel separation grooves T1 and T2 illustrated in FIG. 15 extend in a direction non-parallel and non-perpendicular to the end surfaces of the semiconductor chip. Such a structure is adopted, for example, in a case where it is desirable to set a channel direction of a pixel transistor to be a direction different from both the X direction and the Y direction. Specifically, it is considered that it is sometimes desired to set the channel direction of the pixel transistor to a direction different from both the X direction and the Y direction in a case where a front surface of a wafer (first semiconductor substrate 21) for a photodiode PD is not a plane {100} or in a case where a direction from the center of the wafer toward a notch is not a direction <100>.

Application Examples

Figure 16:
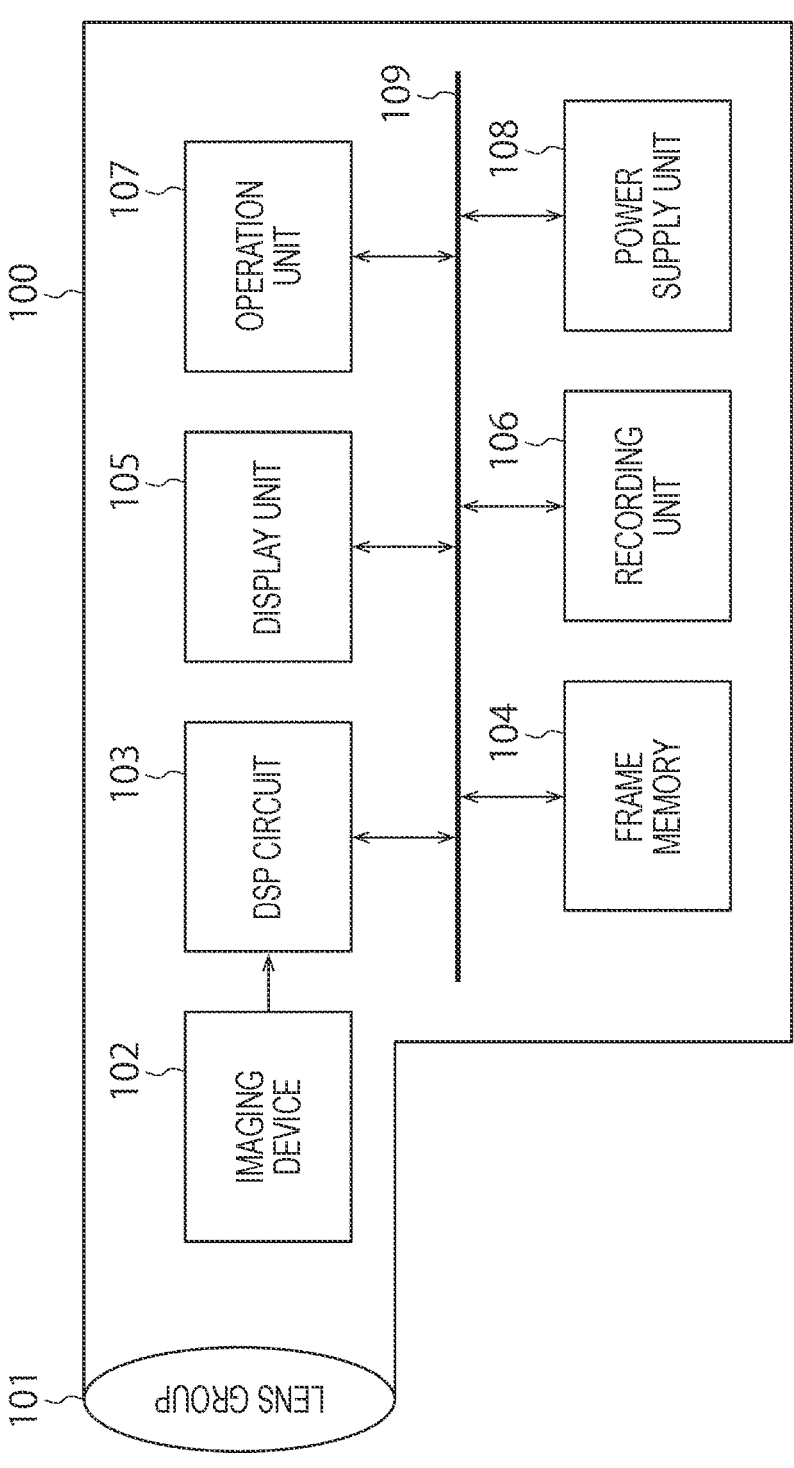
FIG. 16 is a block diagram illustrating a configuration example of an electronic device.

FIG. 16 is a block diagram illustrating a configuration example of an electronic device. The electronic device illustrated in FIG. 16 is a camera 100.

The camera 100 includes an optical unit 101 including a lens group and the like, an imaging device 102 that is the solid-state imaging device according to any of the first to seventh embodiments, a digital signal processor (DSP) circuit 103 that is a camera signal processing circuit, a frame memory 104, a display unit 105, a recording unit 106, an operation unit 107, and a power supply unit 108. Furthermore, the DSP circuit 103, the frame memory 104, the display unit 105, the recording unit 106, the operation unit 107, and the power supply unit 108 are connected to each other via a bus line 109.

The optical unit 101 captures incident light (image light) from a subject and forms an image on an imaging surface of the imaging device 102. The imaging device 102 converts an amount of incident light formed into an image on the imaging surface by the optical unit 101 into an electric signal on a pixel-by-pixel basis and outputs the electric signal as a pixel signal.

The DSP circuit 103 performs signal processing on the pixel signal output from the imaging device 102. The frame memory 104 is a memory for storing one screen of a moving image or a still image captured by the imaging device 102.

The display unit 105 includes, for example, a panel type display device such as a liquid crystal panel or an organic EL panel, and displays a moving image or a still image captured by the imaging device 102. The recording unit 106 records the moving image or still image captured by the imaging device 102 on a recording medium such as a hard disk or a semiconductor memory.

The operation unit 107 issues operation commands for various functions of the camera 100 in response to an operation performed by a user. The power supply unit 108 appropriately supplies various power supplies, which are operation power supplies for the DSP circuit 103, the frame memory 104, the display unit 105, the recording unit 106, and the operation unit 107, to these power supply targets.

It can be expected to acquire a satisfactory image by using the solid-state imaging device according to any of the first to seventh embodiments as the imaging device 102.

The solid-state imaging device can be applied to various other products. For example, the solid-state imaging device may be mounted on any type of mobile bodies such as vehicles, electric vehicles, hybrid electric vehicles, motorcycles, bicycles, personal mobility, airplanes, drones, ships, and robots.

Figure 17:
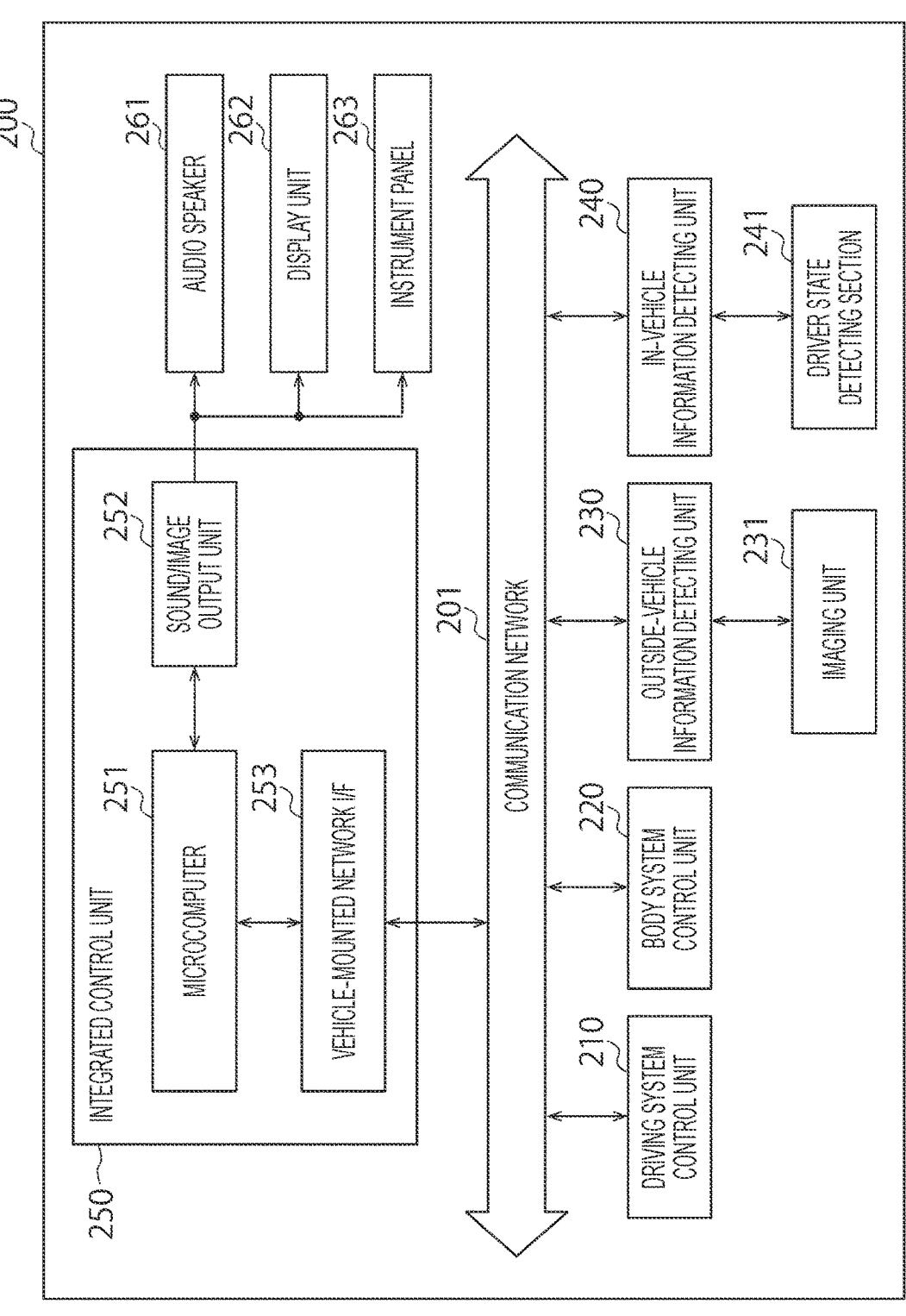
FIG. 17 is a block diagram illustrating a configuration example of a mobile body control system.

FIG. 17 is a block diagram illustrating a configuration example of a mobile body control system. The mobile body control system illustrated in FIG. 17 is a vehicle control system 200.

The vehicle control system 200 includes a plurality of electronic control units connected to each other via a communication network 201. In the example illustrated in FIG. 17, the vehicle control system 200 includes a driving system control unit 210, a body system control unit 220, an outside-vehicle information detecting unit 230, an in-vehicle information detecting unit 240, and an integrated control unit 250. Moreover, FIG. 17 illustrates a microcomputer 251, a sound/image output unit 252, and a vehicle-mounted network interface (I/F) 253 as components of the integrated control unit 250.

The driving system control unit 210 controls the operation of devices related to a driving system of a vehicle in accordance with various types of programs. For example, the driving system control unit 210 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 220 controls the operation of various types of devices provided to a vehicle body in accordance with various types of programs. For example, the body system control unit 220 functions as a control device for a smart key system, a keyless entry system, a power window device, or various types of lamps (for example, a headlamp, a backup lamp, a brake lamp, a turn signal, a fog lamp, or the like). In this case, radio waves transmitted from a mobile device as an alternative to a key or signals of various types of switches can be input to the body system control unit 220. The body system control unit 220 receives inputs of such radio waves or signals, and controls a door lock device, the power window device, the lamps, or the like of the vehicle.

The outside-vehicle information detecting unit 230 detects information about the outside of the vehicle including the vehicle control system 200. For example, the outside-vehicle information detecting unit 230 is connected with an imaging unit 231. The outside-vehicle information detecting unit 230 makes the imaging unit 231 capture an image of the outside of the vehicle, and receives the captured image from the imaging unit 231. On the basis of the received image, the outside-vehicle information detecting unit 230 may perform processing of detecting an object such as a human, a vehicle, an obstacle, a sign, a character on a road surface, or the like, or processing of detecting a distance thereto.

The imaging unit 231 is an optical sensor that receives light and that outputs an electric signal corresponding to the amount of received light. The imaging unit 231 can output the electric signal as an image, or can output the electric signal as information about a measured distance. The light received by the imaging unit 231 may be visible light, or may be invisible light such as infrared rays or the like. The imaging unit 231 includes the solid-state imaging device according to any of the first to seventh embodiments.

The in-vehicle information detecting unit 240 detects information about the inside of the vehicle equipped with the vehicle control system 200. The in-vehicle information detecting unit 240 is, for example, connected with a driver state detecting section 241 that detects a state of a driver. The driver state detecting section 241, for example, includes a camera that captures an image of the driver. On the basis of detection information input from the driver state detecting section 241, the in-vehicle information detecting unit 240 may calculate a degree of fatigue of the driver or a degree of concentration of the driver, or may determine whether or not the driver is dozing. The camera may include the solid-state imaging device according to any of the first to seventh embodiments, and may be, for example, the camera 100 illustrated in FIG. 16.

The microcomputer 251 can calculate a control target value for the driving force generating device, the steering mechanism, or the braking device on the basis of the information about the inside or outside of the vehicle obtained by the outside-vehicle information detecting unit 230 or the in-vehicle information detecting unit 240, and output a control command to the driving system control unit 210. For example, the microcomputer 251 can perform cooperative control intended to implement functions of an advanced driver assistance system (ADAS), the functions including collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 251 can perform cooperative control intended for automated driving, which makes the vehicle travel autonomously without depending on the operation of the driver, or the like, by controlling the driving force generating device, the steering mechanism, the braking device, or the like on the basis of the information about the outside or inside of the vehicle obtained by the outside-vehicle information detecting unit 230 or the in-vehicle information detecting unit 240.

Furthermore, the microcomputer 251 can output a control command to the body system control unit 220 on the basis of the information about the outside of the vehicle obtained by the outside-vehicle information detecting unit 230. For example, the microcomputer 251 can perform cooperative control intended to prevent a glare by controlling the headlamp so as to change from a high beam to a low beam, for example, in accordance with the position of a preceding vehicle or an oncoming vehicle detected by the outside-vehicle information detecting unit 230.

The sound/image output unit 252 transmits an output signal of at least one of a sound or an image to an output device capable of visually or auditorily providing information to an occupant of the vehicle or the outside of the vehicle. In the example of FIG. 17, an audio speaker 261, a display unit 262, and an instrument panel 263 are illustrated as such an output device. The display unit 262 may, for example, include an on-board display or a head-up display.

Figure 18:
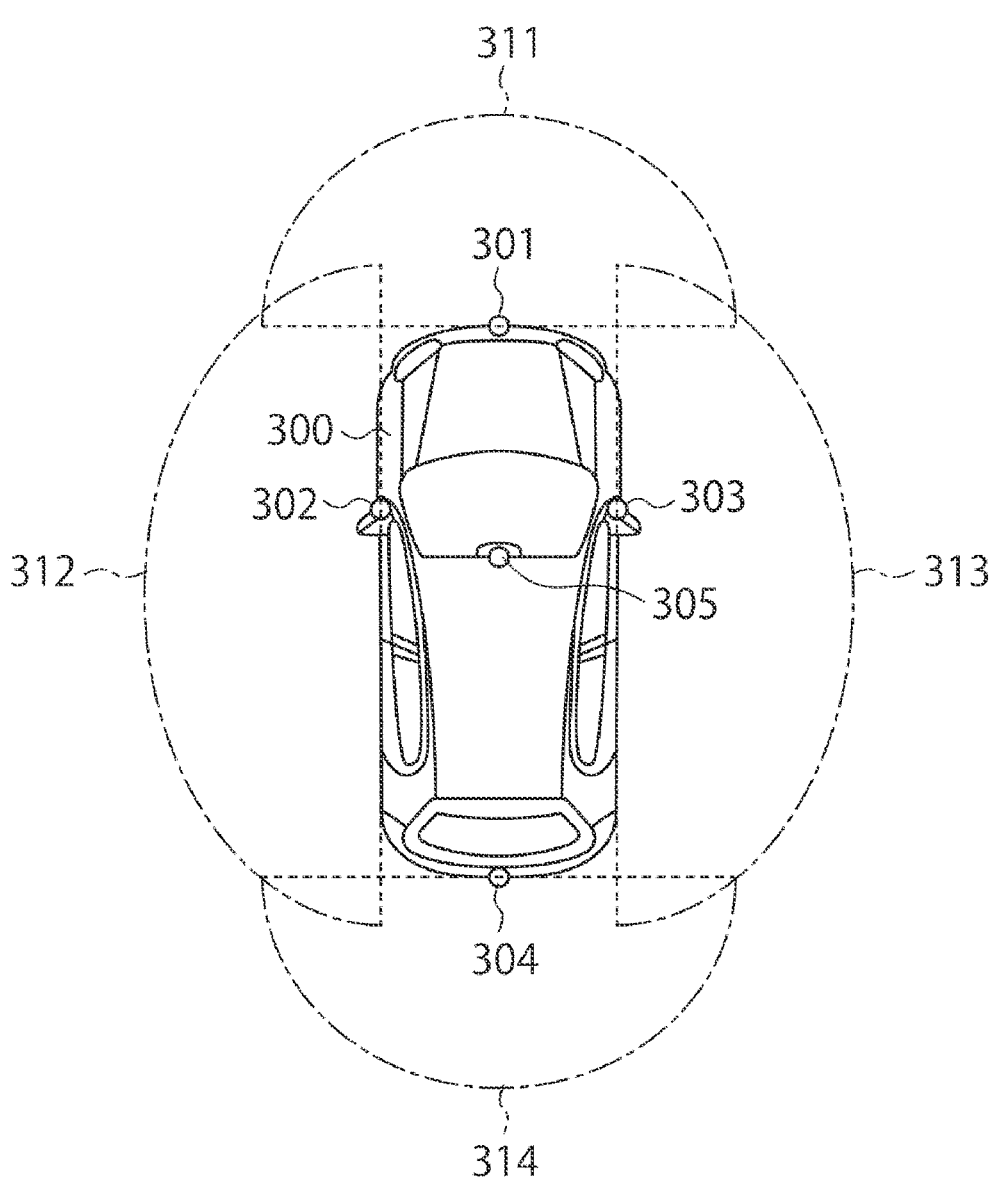
FIG. 18 is a plan view depicting a specific example of a setting position of an imaging unit in FIG. 17.

FIG. 18 is a plan view depicting a specific example of a setting position of the imaging unit 231 in FIG. 17.

A vehicle 300 illustrated in FIG. 18 includes imaging units 301, 302, 303, 304, and 305 as the imaging unit 231. The imaging units 301, 302, 303, 304, and 305 are, for example, provided at positions on a front nose, side mirrors, a rear bumper, and a back door of the vehicle 300, and on an upper portion of a windshield within the interior of the vehicle.

The imaging unit 301 provided on the front nose mainly acquires an image of the front of the vehicle 300. The imaging unit 302 provided on the left side mirror and the imaging unit 303 provided on the right side mirror mainly acquire images of the sides of the vehicle 300. The imaging unit 304 provided to the rear bumper or the back door mainly acquires an image of the rear of the vehicle 300. The imaging unit 305 provided to the upper portion of the windshield within the interior of the vehicle mainly acquires an image of the front of the vehicle 300. The imaging unit 305 is used to detect, for example, a preceding vehicle, a pedestrian, an obstacle, a signal, a traffic sign, a lane, and the like.

FIG. 18 illustrates an example of imaging ranges of the imaging units 301, 302, 303, and 304 (hereinafter referred to as "imaging units 301 to 304"). An imaging range 311 represents the imaging range of the imaging unit 301 provided to the front nose. An imaging range 312 represents the imaging range of the imaging unit 302 provided to the left side mirror. An imaging range 313 represents the imaging range of the imaging unit 303 provided to the right side mirror. An imaging range 314 represents the imaging range of the imaging unit 304 provided to the rear bumper or the back door. For example, a bird's-eye image of the vehicle 300 as viewed from above is obtained by superimposing image data captured by the imaging units 301 to 304, for example. Hereinafter, the imaging ranges 311, 312, 313, and 314 are referred to as the "imaging ranges 311 to 314".

At least one of the imaging units 301 to 304 may have a function of acquiring distance information. For example, at least one of the imaging units 301 to 304 may be a stereo camera including a plurality of imaging devices or an imaging device including pixels for phase difference detection.

For example, the microcomputer 251 (FIG. 17) can determine a distance to each three-dimensional object within the imaging ranges 311 to 314 and a temporal change in the distance (relative speed with respect to the vehicle 300) on the basis of the distance information obtained from the imaging units 301 to 304. On the basis of the calculation results, the microcomputer 251 can extract, as a preceding vehicle, a nearest three-dimensional object that is present on a traveling path of the vehicle 300 and travels in substantially the same direction as the vehicle 300 at a predetermined speed (for example, equal to or more than 0 km/h). Moreover, the microcomputer 251 can set a following distance to be maintained in front of a preceding vehicle in advance, and perform automatic brake control (including following stop control), automatic acceleration control (including following start control), or the like. According to this example, it is thus possible to perform cooperative control intended for automated driving that makes the vehicle travel autonomously without depending on the operation of the driver or the like.

For example, the microcomputer 251 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 301 to 304, extract the classified three-dimensional object data, and use the extracted three-dimensional object data for automatic avoidance of an obstacle. For example, the microcomputer 251 identifies obstacles around the vehicle 300 as obstacles that the driver of the vehicle 300 can recognize visually and obstacles that are difficult for the driver of the vehicle 300 to recognize visually. Then, the microcomputer 251 determines a collision risk indicating a risk of collision with each obstacle. In a situation in which the collision risk is equal to or higher than a set value and there is thus a possibility of collision, the microcomputer 251 outputs a warning to the driver via the audio speaker 261 or the display unit 262, and performs forced deceleration or avoidance steering via the driving system control unit 210. The microcomputer 251 can thereby assist in driving to avoid collision.

At least one of the imaging units 301 to 304 may be an infrared camera that detects infrared rays. The microcomputer 251 can, for example, recognize a pedestrian by determining whether or not there is a pedestrian in captured images captured by the imaging units 301 to 304. Such recognition of a pedestrian is, for example, performed by a procedure of extracting characteristic points in the captured images captured by the imaging units 301 to 304 as infrared cameras and a procedure of determining whether or not an object is a pedestrian by performing pattern matching processing on a series of characteristic points representing the contour of the object. When the microcomputer 251 determines that there is a pedestrian in the captured images captured by the imaging units 301 to 304, and thus recognizes the pedestrian, the sound/image output unit 252 controls the display unit 262 so that a square contour line for emphasis is displayed so as to be superimposed on the recognized pedestrian. Furthermore, the sound/image output unit 252 may also control the display unit 262 so that an icon or the like representing the pedestrian is displayed at a desired position.

Figure 19:
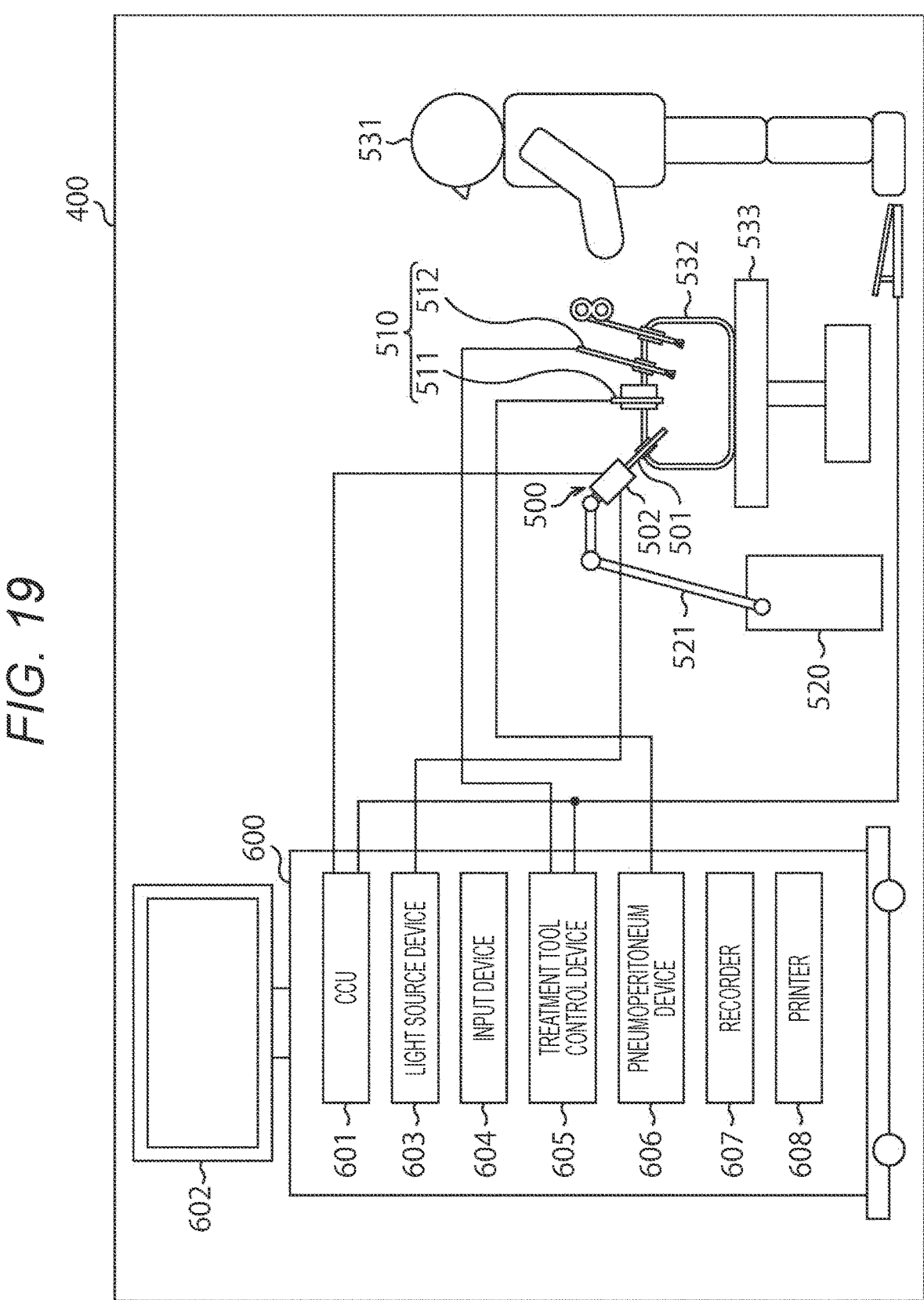
FIG. 19 is a diagram illustrating an example of a schematic configuration of an endoscopic surgical system.

FIG. 19 is a view illustrating an example of a schematic configuration of an endoscopic surgical system to which the technology of the present disclosure (present technology) can be applied.

FIG. 19 illustrates a state in which an operator (doctor) 531 performs surgery on a patient 532 on a patient bed 533 by using an endoscopic surgical system 400. As illustrated, the endoscopic surgical system 400 includes an endoscope 500, other surgical tools 510 such as a pneumoperitoneum tube 511 and an energy treatment tool 512, a supporting arm device 520 for supporting the endoscope 500, and a cart 600 on which various devices for endoscopic surgical are mounted.

The endoscope 500 includes a lens barrel 501 having a region of a predetermined length from a distal end thereof to be inserted into a body cavity of the patient 532, and a camera head 502 connected to a proximal end of the lens barrel 501. Although the illustrated example illustrates that the endoscope 500 is a so-called rigid endoscope having a rigid lens barrel 501, the endoscope 500 may be a so-called flexible endoscope having a flexible lens barrel.

An opening in which an objective lens is fitted is provided at the distal end of the lens barrel 501. A light source device 603 is connected to the endoscope 500, and light generated by the light source device 603 is guided to the distal end of the lens barrel by a light guide extending in the lens barrel 501 and is emitted to a target to be observed in the body cavity of the patient 532 through the objective lens. Note that the endoscope 500 may be a forward-viewing endoscope, an oblique-viewing endoscope, or a side-viewing endoscope.

An optical system and an imaging element are provided in the camera head 502, and light reflected by the target to be observed (observation light) is collected on the imaging element by the optical system. The imaging element photoelectrically converts the observation light and generates an electric signal corresponding to the observation light, that is, an image signal corresponding to an observation image. The image signal is transmitted to a camera control unit (CCU) 601 as RAW data.

The CCU 601 includes a central processing unit (CPU), a graphics processing unit (GPU), and the like, and centrally controls the operations of the endoscope 500 and a display device 602. Moreover, the CCU 601 receives the image signal from the camera head 502 and applies various types of image processing for displaying an image based on the image signal, for example, a development process (demosaicing process) and the like on the image signal.

The display device 602 displays the image based on the image signal which has been subjected to the image processing by the CCU 601 under the control of the CCU 601.

The light source device 603 includes a light source such as a light emitting diode (LED), for example, and supplies irradiation light for imaging a surgical site or the like to the endoscope 500.

An input device 604 is an input interface for the endoscopic surgical system 11000. A user may input various types of information and instructions to the endoscopic surgical system 400 via the input device 604. For example, the user inputs an instruction and the like to change an imaging condition (type of irradiation light, magnification, focal length and the like) by the endoscope 500.

A treatment tool control device 605 controls driving of the energy treatment tool 512 for tissue cauterization, incision, blood vessel sealing, and the like. A pneumoperitoneum device 606 sends gas into the body cavity of the patient 532 via the pneumoperitoneum tube 511 in order to inflate the body cavity for a purpose of securing a field of view by the endoscope 500 and securing work space for the operator. A recorder 607 is a device capable of recording various types of information regarding surgery. A printer 608 is a device capable of printing various types of information regarding surgery in various formats such as a text, an image, or a graph.

Note that, the light source device 603 which supplies the irradiation light for imaging the surgical site to the endoscope 500 may include, for example, an LED, a laser light source, or a white light source obtained by combining these. In a case where the white light source includes a combination of RGB laser light sources, an output intensity and an output timing of each color (each wavelength) can be controlled with high accuracy, whereby the light source device 603 can adjust white balance of a captured image. Furthermore, in this case, images respectively corresponding to the R, G, and B can also be captured in time division by irradiating the target to be observed with laser light from each of the RGB laser light sources in time division, and controlling the driving of the imaging element of the camera head 502 in synchronization with the irradiation timing. According to this method, a color image can be obtained even if color filters are not provided for the imaging element.

Furthermore, the driving of the light source device 603 may be controlled such that the intensity of light to be output is changed every predetermined time. The driving of the imaging element of the camera head 502 is controlled in synchronization with a timing of changing the light intensity to obtain the images in time division, and the obtained images are synthesized, whereby an image with a high dynamic range that does not have so-called blocked up shadows and blown-out highlights can be generated.

Furthermore, the light source device 603 may be able to supply light in a predetermined wavelength band adapted to special light observation. In the special light observation, for example, light in a narrower band than irradiation light (in other words, white light) at the time of normal observation is emitted using wavelength dependency of a body tissue to absorb light, whereby so-called narrow band imaging is performed in which an image of a predetermined tissue, such as a blood vessel in a mucosal surface layer, is captured with high contrast. Alternatively, in the special light observation, fluorescence observation for obtaining an image by fluorescence generated by irradiation of excitation light may be performed. In the fluorescence observation, it is possible to irradiate a body tissue with excitation light to observe fluorescence from the body tissue (autofluorescence observation) or to locally inject a reagent such as indocyanine green (ICG) to a body tissue and irradiate the body tissue with excitation light corresponding to a fluorescent wavelength of the reagent, thereby obtaining a fluorescent image, for example. The light source device 603 can be configured to be able to supply narrow band light and/or excitation light adapted to such special light observation.

Figure 20:
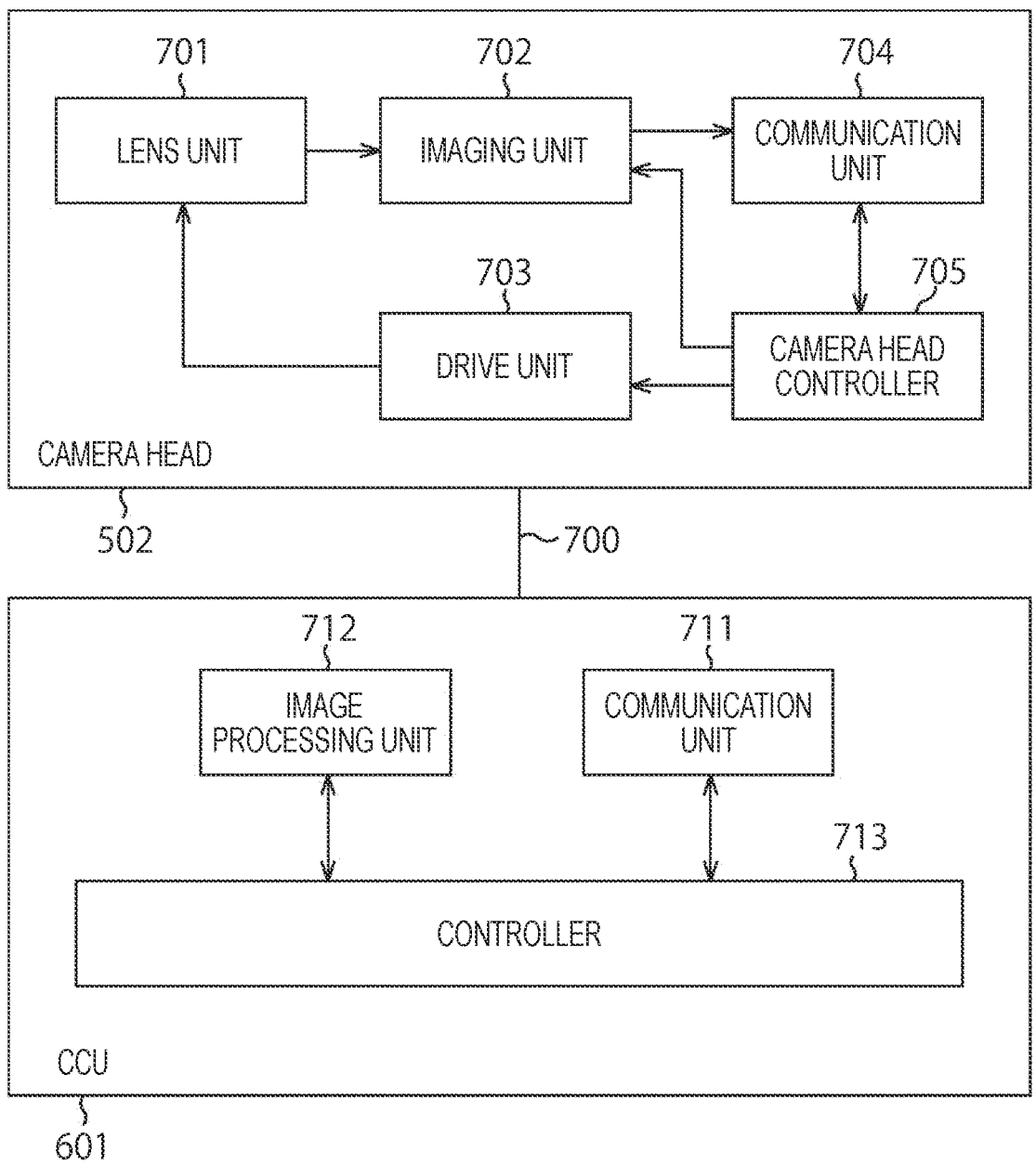
FIG. 20 is a block diagram illustrating an example of a functional configuration of a camera head and a CCU.

FIG. 20 is a block diagram illustrating an example of functional configurations of the camera head 502 and the CCU 601 illustrated in FIG. 19.

The camera head 502 includes a lens unit 701, an imaging unit 702, a drive unit 703, a communication unit 704, and a camera head controller 705. The CCU 601 includes a communication unit 711, an image processing unit 712, and a controller 713. The camera head 502 and the CCU 601 are connected to each other so as to be able to communicate by a transmission cable 700.

The lens unit 701 is an optical system provided at a connecting portion with the lens barrel 501. The observation light captured from the distal end of the lens barrel 501 is guided to the camera head 502 and enters the lens unit 701. The lens unit 701 is configured by combining a plurality of lenses including a zoom lens and a focus lens.

The imaging unit 702 includes an imaging element. The number of imaging element constituting the imaging unit 702 may be one (so-called single plate type) or two or more (so-called multiple plate type). In a case where the imaging unit 702 is of the multiple plate type, image signals corresponding to R, G, and B may be generated by the respective imaging elements, and a color image may be obtained by combining the generated image signals, for example. Alternatively, the imaging unit 702 may include a pair of imaging elements for obtaining right-eye and left-eye image signals corresponding to three-dimensional (3D) display. By the 3D display, the operator 531 can grasp a depth of a living body tissue in a surgical site more accurately. Note that, in a case where the imaging unit 702 is of the multiple plate type, a plurality of systems of lens units 701 may be provided so as to correspond to the respective imaging elements. The imaging unit 702 is, for example, the solid-state imaging device according to any of the first to seventh embodiments.

Furthermore, the imaging unit 702 is not necessarily provided in the camera head 502. For example, the imaging unit 702 may be provided inside the lens barrel 501 immediately behind the objective lens.

The drive unit 703 includes an actuator and moves the zoom lens and the focusing lens of the lens unit 701 by a predetermined distance along an optical axis under the control of the camera head controller 705. Therefore, the magnification and focal point of the image captured by the imaging unit 702 may be appropriately adjusted.

The communication unit 704 includes a communication device for transmitting and receiving various types of information to and from the CCU 601. The communication unit 704 transmits the image signal obtained from the imaging unit 702 as the RAW data to the CCU 601 via the transmission cable 700.

Furthermore, the communication unit 704 receives a control signal for controlling driving of the camera head 502 from the CCU 601 and supplies the control signal to the camera head controller 705. The control signal includes, for example, information regarding an imaging condition such as information specifying a frame rate of a captured image, information specifying an exposure value at the time of imaging, and/or information specifying the magnification and focal point of the captured image.

Note that the imaging conditions such as the frame rate, exposure value, magnification, and focus described above may be appropriately specified by the user, or may be automatically set by the controller 713 of the CCU 601 on the basis of the acquired image signal. In the latter case, the endoscope 500 is equipped with a so-called auto exposure (AE) function, an auto focus (AF) function, and an auto white balance (AWB) function.

The camera head controller 705 controls the driving of the camera head 502 on the basis of the control signal from the CCU 601 received via the communication unit 704.

The communication unit 711 includes a communication device for transmitting and receiving various types of information to and from the camera head 502. The communication unit 711 receives the image signal transmitted from the camera head 502 via the transmission cable 700.

Furthermore, the communication unit 711 transmits the control signal for controlling the driving of the camera head 502 to the camera head 502. The image signal and the control signal can be transmitted by electrical communication, optical communication or the like.

The image processing unit 712 performs various types of image processing on the image signal which is the RAW data transmitted from the camera head 502.

The controller 713 performs various types of control regarding imaging of the surgical site and the like by the endoscope 500 and display of the captured image obtained by the imaging of the surgical site and the like. For example, the controller 713 generates the control signal for controlling the driving of the camera head 502.

Furthermore, the controller 713 allows the display device 602 to display the captured image including the surgical site and the like on the basis of the image signal subjected to the image processing by the image processing unit 712. At that time, the controller 713 may recognize various objects in the captured image using various image recognition technologies. For example, the controller 713 may detect edge shapes, colors, and the like of the objects included in the captured image, thereby recognizing the surgical tool such as forceps, a specific living body site, bleeding, mist when the energy treatment tool 512 is used, and the like. When causing the display device 602 to display the captured image, the controller 713 may overlay various types of surgery assistance information on the image of the surgical site using the recognition result. The surgery support information is displayed to be overlaid and presented to the operator 531, so that it is possible to reduce the burden on the operator 531 and enable the operator 531 to reliably proceed with surgery.

The transmission cable 700 connecting the camera head 502 and the CCU 601 is an electric signal cable compatible with communication of electric signals, an optical fiber compatible with optical communication, or a composite cable thereof.

Here, the communication is performed by wire using the transmission cable 700 in the illustrated example, but the communication between the camera head 502 and the CCU 601 may be performed wirelessly.

Although the embodiments of the present disclosure have been described above, these embodiments may be implemented with various modifications within a scope not departing from the gist of the present disclosure. For example, two or more embodiments may be implemented in combination.

Note that the present disclosure can also have the following configurations.

(1)

A solid-state imaging device including:

first and second photoelectric conversion units that are provided in a first semiconductor substrate and are adjacent to each other;

a first pixel separation groove provided between the first photoelectric conversion unit and the second photoelectric conversion unit not to penetrate through the first semiconductor substrate; and a second pixel separation groove provided to penetrate through the first semiconductor substrate.

(2)

The solid-state imaging device according to (1), in which the first pixel separation groove is provided from a side of a light incident surface of the first semiconductor substrate toward a surface of the first semiconductor substrate on a side opposite to the light reflecting surface.

(3)

The solid-state imaging device according to (1), in which the second pixel separation groove is provided to surround at least the first and second photoelectric conversion units in a plan view.

(4)

The solid-state imaging device according to (1), in which the second pixel separation groove forms a pixel separation groove that surrounds the first and second photoelectric conversion units for each of the photoelectric conversion units together with the first pixel separation groove.

(5)

The solid-state imaging device according to (1), in which the second pixel separation groove is further provided between the first photoelectric conversion unit and the second photoelectric conversion unit together with the first pixel separation groove.

(6)

The solid-state imaging device according to (1), in which the second pixel separation groove surrounds N photoelectric conversion units (N is an integer of two or more) including the first and second photoelectric conversion units, and the N photoelectric conversion units correspond to one on-chip lens provided on the first semiconductor substrate.

(7)

The solid-state imaging device according to (6), in which the N photoelectric conversion units are provided in N pixels which are pixels of an identical color.

(8)

The solid-state imaging device according to (1), in which the second pixel separation groove surrounds N photoelectric conversion units (N is an integer of two or more) including the first and second photoelectric conversion units, and the N photoelectric conversion units correspond to two lenses provided on the first semiconductor substrate.

(9)

The solid-state imaging device according to (1), in which the second pixel separation groove surrounds N photoelectric conversion units (N is an integer of two or more) including the first and second photoelectric conversion units, and the N photoelectric conversion units correspond to N on-chip lenses provided on the first semiconductor substrate.

(10)

The solid-state imaging device according to (9), in which the N is a square of K (K is an integer of three or more).

(11)

The solid-state imaging device according to (1), further including a floating diffusion unit provided at a position at least partially overlapping the first pixel separation groove in a plan view in the first semiconductor substrate.

(12)

The solid-state imaging device according to (11), in which the first pixel separation groove includes a first portion extending in a first direction and a second portion extending in a second direction, and the floating diffusion unit is provided at a position at least partially overlapping an intersection portion between the first portion and the second portion in a plan view in the first semiconductor substrate.

(13)

The solid-state imaging device according to (1), in which the first pixel separation groove includes a first portion extending in a first direction and a second portion extending in a second direction, and the first direction and the second direction are non-parallel and non-perpendicular to an end surface of a chip including the solid-state imaging device.

(14)

The solid-state imaging device according to (1), further including first and second transfer transistors that are provided under the first and second photoelectric conversion units and have gate electrodes, respectively, being at least partially provided in a first interlayer insulating film.

(15)

The solid-state imaging device according to (14), in which the second pixel separation groove surrounds N photoelectric conversion units (N is an integer of two or more) including the first and second photoelectric conversion units, the solid-state imaging device further includes a reset, selection, or amplification transistor provided under any photoelectric conversion unit of the N photoelectric conversion units, and the first transfer transistor, the second transfer transistor, and the reset, selection, or amplification transistor being provided on the surface of the first semiconductor substrate on the side opposite to the light incident surface.

(16)

The solid-state imaging device according to (15), further including a second semiconductor substrate that is provided to face a first interlayer insulating film provided on a surface of the first semiconductor substrate on a side opposite to a light incident surface, in which the second semiconductor substrate includes at least a part of a pixel transistor other than the transfer transistors.

(17)

A solid-state imaging device including:

first and second photoelectric conversion units that are provided in the first semiconductor substrate and are adjacent to each other;

a floating diffusion unit provided in the first semiconductor substrate; and first and second transfer transistors respectively provided under the first and second photoelectric conversion units, in which the first and second transfer transistors operate to provide a first mode in which a path of a charge from the first photoelectric conversion unit to the floating diffusion unit is closed and a path of a charge from the first photoelectric conversion unit to the second photoelectric conversion unit is closed, a second mode in which the path of the charge from the first photoelectric conversion unit to the floating diffusion unit is closed, and the path of the charge from the first photoelectric conversion unit to the second photoelectric conversion unit is opened, and a third mode in which the path of the charge from the first photoelectric conversion unit to the floating diffusion unit is opened.

(18)

The solid-state imaging device according to (17), further including a first pixel separation groove provided between the first photoelectric conversion unit and the second photoelectric conversion unit not to penetrate through the first semiconductor substrate, in which the floating diffusion unit is provided under the first pixel separation groove in the first semiconductor substrate.

(19)

The solid-state imaging device according to (18), further including a second pixel separation groove provided to penetrate through the first semiconductor substrate, in which the second pixel separation groove is provided to surround at least the first and second photoelectric conversion units in a plan view.

(20)

The solid-state imaging device according to (19), further including a second semiconductor substrate that is provided to face a first interlayer insulating film provided on a surface of the first semiconductor substrate on a side opposite to a light incident surface, in which the second semiconductor substrate includes at least a part of a pixel transistor other than the transfer transistors.

REFERENCE SIGNS LIST

1 Pixel
2 Pixel array region
3 Control circuit
4 Vertical drive circuit
5 Column signal processing circuit
6 Horizontal drive circuit
7 Output circuit
8 Vertical signal line 9 Horizontal signal line
11 Upper substrate
12 Intermediate substrate
13 Lower substrate
14 Light shielding film
15 Planarization film
16 Color filter
17 On-chip lens
21 First semiconductor substrate
21a n type semiconductor region
21b p+ type semiconductor region
21c p type semiconductor region
21d n type semiconductor region
21e n type semiconductor region
22 First interlayer insulating film
23 Gate insulating film
24 Gate electrode
25 Insulating film
26 Insulating film
31 Second semiconductor substrate
31a Impurity semiconductor region
32 Second interlayer insulating film
32a Insulating film
32b Insulating film
33 Gate insulating film
34 Gate electrode
35 Plug
36 First wiring layer
37 Second wiring layer
38 Third wiring layer
39 Fourth wiring layer
41 Third semiconductor substrate
41a Impurity semiconductor region
42 Third interlayer insulating film
42a Insulating film
42b Insulating film
43 Gate insulating film
44 Gate electrode
45 Plug
46 Fifth wiring layer
47 Sixth wiring layer
48 Seventh wiring layer

The invention claimed is:

1. A solid-state imaging device comprising:

first and second photoelectric conversion units that are provided in a first semiconductor substrate and are adjacent to each other;

a first pixel separation groove provided between the first photoelectric conversion unit and the second photoelectric conversion unit and configured not to penetrate through the first semiconductor substrate so as to permit charge transfer between the first and second photoelectric conversion units in at least one operating mode;

a second pixel separation groove provided to penetrate through the first semiconductor substrate and configured to electrically isolate the first and second photoelectric conversion units from other photoelectric conversion units in the first semiconductor substrate; and first and second transfer transistors respectively associated with the first and second photoelectric conversion units, the first and second transfer transistors being operable to selectively enable or disable the charge transfer permitted by the first pixel separation groove.

2. The solid-state imaging device according to claim 1, wherein the first pixel separation groove is provided from a side of a light incident surface of the first semiconductor substrate toward a surface of the first semiconductor substrate on a side opposite to a light reflecting surface.

3. The solid-state imaging device according to claim 1, wherein the second pixel separation groove is provided to surround at least the first and second photoelectric conversion units in a plan view.

4. The solid-state imaging device according to claim 1, wherein the second pixel separation groove forms a pixel separation groove that surrounds the first and second photoelectric conversion units together with the first pixel separation groove.

5. The solid-state imaging device according to claim 1, wherein the second pixel separation groove is further provided between the first photoelectric conversion unit and the second photoelectric conversion unit together with the first pixel separation groove.

6. The solid-state imaging device according to claim 1, wherein
   the second pixel separation groove surrounds N photoelectric conversion units (N is an integer of two or more) including the first and second photoelectric conversion units, and
   the N photoelectric conversion units correspond to one on-chip lens provided on the first semiconductor substrate.

7. The solid-state imaging device according to claim 6, wherein the N photoelectric conversion units are provided in N pixels which are pixels of an identical color.

8. The solid-state imaging device according to claim 1, wherein
   the second pixel separation groove surrounds N photoelectric conversion units (N is an integer of two or more) including the first and second photoelectric conversion units, and
   the N photoelectric conversion units correspond to two lenses provided on the first semiconductor substrate.

9. The solid-state imaging device according to claim 1, wherein
   the second pixel separation groove surrounds N photoelectric conversion units (N is an integer of two or more) including the first and second photoelectric conversion units, and
   the N photoelectric conversion units correspond to N on-chip lenses provided on the first semiconductor substrate.

10. The solid-state imaging device according to claim 9, wherein the N is a square of K (K is an integer of three or more).

11. The solid-state imaging device according to claim 1, further comprising a floating diffusion unit provided at a position at least partially overlapping the first pixel separation groove in a plan view in the first semiconductor substrate.

12. The solid-state imaging device according to claim 11, wherein
   the first pixel separation groove includes a first portion extending in a first direction and a second portion extending in a second direction, and
   the floating diffusion unit is provided at a position at least partially overlapping an intersection portion between the first portion and the second portion in a plan view in the first semiconductor substrate.

13. The solid-state imaging device according to claim 1, wherein
   the first pixel separation groove includes a first portion extending in a first direction and a second portion extending in a second direction, and the first direction and the second direction are non-parallel and non-perpendicular to an end surface of a chip including the solid-state imaging device.

14. The solid-state imaging device according to claim 1, wherein the first and second transfer transistors are provided under the first and second photoelectric conversion units and have gate electrodes, respectively, that are at least partially provided in a first interlayer insulating film.

15. The solid-state imaging device according to claim 14, wherein the second pixel separation groove surrounds N photoelectric conversion units (N is an integer of two or more) including the first and second photoelectric conversion units,
   the solid-state imaging device further comprises a reset, selection, or amplification transistor provided under any photoelectric conversion unit of the N photoelectric conversion units, and
   the first transfer transistor, the second transfer transistor, and the reset, selection, or amplification transistor are provided on a surface of the first semiconductor substrate that is opposite to a light incident surface of the first semiconductor substrate.

16. The solid-state imaging device according to claim 15, further comprising a second semiconductor substrate that is provided to face the first interlayer insulating film provided on the surface of the first semiconductor substrate that is opposite to the light incident surface,
   wherein the second semiconductor substrate includes at least a part of a pixel transistor other than the transfer transistors.

17. A solid-state imaging device comprising:
   first and second photoelectric conversion units that are provided in a first semiconductor substrate and are adjacent to each other;
   a floating diffusion unit provided in the first semiconductor substrate;
   first and second transfer transistors respectively provided under the first and second photoelectric conversion units; and
   a first pixel separation groove provided between the first photoelectric conversion unit and the second photoelectric conversion unit and configured not to penetrate through the first semiconductor substrate, the floating diffusion unit being provided under the first pixel separation groove in the first semiconductor substrate,
   wherein the first and second transfer transistors operate to provide
   a first mode in which a path of a charge from the first photoelectric conversion unit to the floating diffusion unit is closed and a path of a charge from the first photoelectric conversion unit to the second photoelectric conversion unit is closed,
   a second mode in which the path of the charge from the first photoelectric conversion unit to the floating diffusion unit is closed, and the path of the charge from the first photoelectric conversion unit to the second photoelectric conversion unit is opened, and
   a third mode in which the path of the charge from the first photoelectric conversion unit to the floating diffusion unit is opened.

18. The solid-state imaging device according to claim 17, further comprising a second pixel separation groove provided to penetrate through the first semiconductor substrate,
   wherein the second pixel separation groove is provided to surround at least the first and second photoelectric conversion units in a plan view.

19. The solid-state imaging device according to claim 18, further comprising a second semiconductor substrate that is provided to face a first interlayer insulating film provided on a surface of the first semiconductor substrate on a side opposite to a light incident surface, wherein the second semiconductor substrate includes at least a part of a pixel transistor other than the transfer transistors.

20. The solid-state imaging device according to claim 17, wherein, in the second mode, the path of the charge from the first photoelectric conversion unit to the second photoelectric conversion unit is opened via a region under the first pixel separation groove.

* * * * *